(12) United States Patent
Kokubo et al.

(10) Patent No.: US 7,477,676 B2
(45) Date of Patent: Jan. 13, 2009

(54) SPREAD SPECTRUM CLOCK GENERATOR AND INTEGRATED CIRCUIT DEVICE USING THE SPREAD SPECTRUM CLOCK GENERATORS

(75) Inventors: Masaru Kokubo, Hanno (JP); Yoshiyuki Shibahara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 723 days.

(21) Appl. No.: 10/863,507

(22) Filed: Jun. 9, 2004

(65) Prior Publication Data

US 2005/0008113 A1   Jan. 13, 2005

(30) Foreign Application Priority Data

Jul. 9, 2003   (JP) .............................. 2003-194058
Apr. 22, 2004  (JP) .............................. 2004-126341

(51) Int. Cl.
    *H04B 1/00*   (2006.01)
(52) U.S. Cl. ...................................... 375/130; 375/376
(58) Field of Classification Search ................ 375/130, 375/375, 376; 331/1, 16
    See application file for complete search history.

(56) References Cited

U.S. PATENT DOCUMENTS

| 5,488,627 A |   | 1/1996  | Hardin et al.   | 375/204 |
| 5,986,512 A | * | 11/1999 | Eriksson        | 331/16  |
| 6,044,124 A | * | 3/2000  | Monahan et al.  | 375/376 |
| 6,292,507 B1| * | 9/2001  | Hardin et al.   | 375/130 |
| 6,559,698 B1| * | 5/2003  | Miyabe          | 327/157 |
| 6,600,378 B1| * | 7/2003  | Patana          | 331/1 A |
| 6,717,998 B2| * | 4/2004  | Adachi et al.   | 375/376 |
| 6,980,581 B1| * | 12/2005 | Sha et al.      | 375/130 |
| 7,072,633 B2| * | 7/2006  | Gomez et al.    | 455/260 |
| 2003/0039330 A1 |   | 2/2003 | Castiglione et al. | 375/376 |
| 2004/0164809 A1 | * | 8/2004 | Gibbs           | 331/1 A |

FOREIGN PATENT DOCUMENTS

| JP | 7-235862    | 9/1995 |
| JP | 2000-228658 | 8/2000 |
| JP | 2002-140130 | 5/2002 |
| JP | 2002-246900 | 8/2002 |

OTHER PUBLICATIONS

B. Razavi, "Design of Analog CMOS Integrated Circuits", pp. 532-562 and 572-574, published Aug. 12, 1999 by The McGraw-Hill Companies, Inc.
J-Y. Michel, et al., "A Frequency Modulated PLL for EMI Reducution in Embedded Application", pp. 362-365, 1999.

* cited by examiner

*Primary Examiner*—Chieh M Fan
*Assistant Examiner*—Jaison Joseph
(74) *Attorney, Agent, or Firm*—Antonelli, Terry, Stout & Kraus, LLP.

(57) ABSTRACT

The present invention provides a spread spectrum clock generator that is capable of preventing phase jumps and jitters and suppressing the occurrence of Electro Magnetic Interference components and that can easily be applied to large scale integrated circuits. The spread spectrum clock generator can be configured with a filter, quantizer, fractional divider, and other elements. Also, this clock generator circuitry can be configured by combination of a delta-sigma $\Delta\Sigma$ quantizer and factional divider so that sine wave modulation and random number modulation can be realized. Thereby, control with digital values can be performed. This clock generator prevents precipitous phase variations in the output high frequency clock and makes fine phase control possible. Consequently, EMI reduction by 20-30 dB can be expected.

20 Claims, 27 Drawing Sheets

SPREAD SPECTRUM CLOCK GENERATOR AND INTEGRATED CIRCUIT DEVICE USING THE SPREAD SPECTRUM CLOCK GENERATORS

CLAIM OF PRIORITY

The present application claims priority from Japanese patent application serial no. JP 2004-126341 filed on Apr. 22, 2004, which further claims priority from Japanese patent application serial no. JP 2003-194058 filed on Jul. 9, 2003, the contents of which are hereby incorporated by reference into this application.

BACKGROUND OF THE INVENTION

1. Field of the Invention

The present invention relates to circuitry which generates a clock for controlling signal processing devices integrated on a semiconductor chip. More particularly, the invention relates to a spread spectrum clock generator using a spread spectrum technique and an integrated circuit device employing the spread spectrum clock generator.

2. Description of the Related Art

Signal processing devices integrated on a semiconductor chip, such integration being called a microprocessor, are often used for purposes such as generating a control signal for an appropriate control task from an input signal. In the microprocessor, circuitry to generate a clock for allowing the integrated signal processing devices and external memory devices to cooperate is used. Such clock generating circuitry is hereinafter referred to as a clock generator.

The clock generator to which a stable, periodic reference clock, which is typically generated by a crystal oscillator or an analog oscillator using resistor and capacitor time constant, is supplied from a pin provided on an integrated circuit structure, has a function to generate from the reference clock a high-frequency clock for allowing the signal processing devices in the integrated circuit structure and memory devices to cooperate.

However, the use of a highly stable reference clock generated by the crystal oscillator or the like may give rise to Electro Magnetic Interference to electronics outside the integrated circuit structure and it has been required to take a suitable shield technique that is capable of suppressing the Electro Magnetic Interference. As the shield technique, for example, an arrangement in which the circuit block containing the integrated circuit structure is surrounded with metal plates connected to GND (ground potential) at a low impedance was taken. To reduce electromagnetic emission that causes the Electro Magnetic Interference, methods for generating a reference clock with a frequency that varies in a predetermined cycle have been studied. Techniques for reducing the Electro Magnetic Interference are described in Patent Documents 1, 2, and 3.

An example of a prior art clock generator for reducing the ElectroMagnetic Interference is shown in FIG. 16. This clock generator comprises a phase locked loop (hereinafter reference to as a PLL) which is made up of a phase comparator (CMP) 1 to which a reference clock fr is input, a charge pump (CP) 2, a loop filter (LPF) 3, a voltage control oscillator (hereinafter referred to as a VCO) 4, and a divider (DIV) 5, the clock generator also comprising an address generator (AD_GEN) 40 to which the reference clock fr is also input and a lookup table (LTB) 41 (the clock generator configured in this way is discussed in Patent Document 1, for example). The method for generating a high-frequency clock by means of the PLL is well known and, moreover, the principle of generating a high-frequency clock with the PLL is described in Non-Patent Document 1; hence, its detailed description is omitted here. The PLL has a function to modulate the reference clock fr and output a high-frequency clock fo scaled up by a factor corresponding to a division number N of the divider 5.

The address generator 40 shown in FIG. 16 generates an address in the lookup table 41 in sync with the reference clock fr and the lookup table 41 outputs a division number of the divider 5 retrieved from that address. In the lookup table 41, a sine function or a predetermined function whose values are addressed is stored in advance. Address change depending on the reference clock fr changes the division number that is an integer output from the lookup table.

Division number change in turn changes the frequency of the high-frequency clock fo that is output from the PLL. Consequently, time during which the clock occupies the same frequency becomes shorter and the intensity of the Electro Magnetic Interference can be lessened. By setting an average value of the function that is stored in the lookup table 41 with regard to the time axis to N, the high-frequency clock fo obtained from the PLL has an average frequency fr×N, and, thus, a relatively stable high-frequency clock can be obtained.

Another example of a prior art clock generator to reduce the Electro Magnetic Interference, using the PLL, is shown in FIG. 17. This clock generator is made up of a phase comparator 1, to which the reference clock fr is input, a charge pump 2, a loop filter 3, a modulator (MOD) 29, a VCO 4, and a divider 5 (the clock generator configured in this way is discussed in Patent Document 2, for example) This clock generator generates a high-frequency clock by the PLL, in the respect of which, it is the same as the above-described prior art, but the modulator 29 is inserted between the loop filter 3 and the VCO 4. With the modulator 29 thus inserted to give a modulating signal mod which is any analog modulated signal, frequency modulation of the high-frequency clock fo can be performed. For example, by using a sine wave as the modulating signal mod, it can be expected to generate a highly precise spread spectrum clock.

An example of prior art for reducing the Electro Magnetic Interference by means of a divider is described in, for example, Patent Document 4. This method is to store random numbers in a lookup table and output a signal to control the division number from the lookup table in sync with the reference clock fr. Because the division number is controlled by a non-periodic control signal, divided clock frequencies can vary, free from periodicity.

[Patent Document 1]

Japanese Published Unexamined Patent Application No. H07-235862

[Patent Document 2]

Japanese Published Unexamined Patent Application No. 2002-246900

[Patent Document 3]

Japanese Published Unexamined Patent Application No. 2002-140130

[Patent Document 4]

Japanese Published Unexamined Patent Application No. 2000-228658

[Non-Patent Document 1]
"Design of Analog CMOS Integrated Circuits" by Prof. Behzad Razavi, pp. 532-562 and pp. 572-574, published on Aug. 12, 1999 from The McGraw-Hill Companies, Inc.

SUMMARY OF THE INVENTION

Clock generation methods that have heretofore been applied to reduce Electro Magnetic Interference have aimed at shortening time during which the clock occupies a particular frequency by clock frequency modulation, thereby reducing the Electro Magnetic Interference. However, these methods are regarded as insufficient in effectively reducing the Electro Magnetic Interference, because the following problems are not well taken into consideration.

First, as applied in the methods according to the above-mentioned Patent Documents 1 through 3, the mechanism of controlling the divider controls a division number that must be an integer. As a result, a sharp phase change occurs in the output high-frequency clock fo. Therefore, a method of simulating a triangle wave and similar function in steps is taken. Such a phase jump gives rise to additional Electro Magnetic Interference components and jitters, which poses a problem.

Second, the above methods are vulnerable to noise produced from digital circuits. As described above, to realize modulation that is highly effective for suppressing the Electro Magnetic Interference, using sine waves or the like, the clock generator employing an analog modulator and a sine wave generator with a high precision must be constructed, as set forth in Patent Document 2. However, if the above clock generator is realized on a semiconductor chip in which relatively large digital circuits are integrated like a microprocessor, additional means for suppressing the noise generated by the digital circuits must be provided and such realization is extremely difficult. Thus, the application of the above clock generator is limited to small integrated circuits. Also, it is not easy to realize the above clock generator compatible with adopting a fine device rule designed for integrated circuits.

It is therefore an object of the present invention to provide a spread spectrum clock generator that is capable of effective suppression of ElectroMagnetic Interference, dispensing with analog circuits for which high precision requirements are specified, in other words, by employing digital circuits and the PLL.

It is another object of the present invention is to provide an integrated circuit device using this spread spectrum clock generator.

Byway of example, some of typical means of the present invention will be described below:

(1) A spread spectrum clock generator according to the present invention comprises a phase locked loop (PLL) which comprises a phase comparator to which a reference clock is input, a voltage control oscillator which generates an oscillation frequency that is variable in response to the phase comparator output, and a divider which divides the voltage control oscillator output by an alterable division number, wherein the divider output is fed back to the phase comparator, the clock generator further comprising a control circuit which comprises a signal generator which generates a signal defined so that it can generate a required function of digital representation, a filter which is connected to the signal generator output to suppress high frequency components of noise included in the signal, a quantizer which is connected to the filter output to convert non-integral data in the fraction part included in the filter output to an integer by integral approximation, and an adder connected to the quantizer output to add the quantizer output and the division number, characterized in that the division number of the divider can be altered by the output of the control circuit.

(2) In the above item (1), the signal generator may be configured as a device having a lookup table.

(3) In the above item (1), the filter may be configured as a Finite Impulse Response (FIR) type, Infinite Impulse Response (IIR) type, or a combination thereof.

(4) In the above item (1), preferably, the quantizer comprises first to fifth adders, first to third integrators, first and second comparators, and first and second subtractors, wherein:

a signal input to the quantizer is input to one input of the first adder;

the first adder output is integrated by the first integrator;

the first integrator output is input to one input of the second adder;

the second adder output is input to the second integrator;

the second integrator output is input to the first comparator where its polarity is judged by a predetermined threshold;

the first comparator output is input to the other inputs of the first and second adders;

the first comparator output and the second integrator output are input to the third adder;

the third adder output is input to one input of the fourth adder;

the fourth adder output is input to the input of the third integrator;

the third integrator output is input to the second comparator where its polarity is judged by a predetermined threshold;

the second comparator output is input to the other input of the fourth adder and the first subtractor;

the first subtractor output is input to the second subtractor; and the second subtractor output and the first comparator output are input to the fifth adder.

(5) In the above item (1), preferably, the loop band width of the PLL is broader than the band width of a signal that is spread and lower than a half of the frequency of the reference clock that is input to the phase comparator.

(6) An integrated circuit device according to the present invention comprises, internally, a CPU, signal processing devices such as logic circuits, installed on a semiconductor chip, and a clock generator which generates a clock, based on which the signal processing devices operate, characterized in that the clock generator is the spread spectrum clock generator described in the above item (1).

By configuring the clock generator as described in the item (1), Electro Magnetic Interference components and jitters that still occur due to a phase jump can be prevented, which will be explained briefly below.

FIG. 18 shows graphic representations of noise vs. loop band width relationships for spread spectrum clock generator embodiment variants of the present invention. In FIG. 18, the ordinate indicates level (LV) and the abscissa indicates frequency (f); Na1 to Na3 are noise distributions that types of quantizers generate; fPPL is a closed loop characteristic of the PLL; Nb1 to Nb3 are total noise distributions which are the products of Na1 to Na3 multiplied by fPLL.

Noise components included in the output of a quantizer based on delta-sigma $\Delta\Sigma$ modulation are distributed, giving a mountainous curve with its center peak being ½ of a sample frequency. In the present invention, because the reference clock fr is used as the sampling frequency, noise distributions with their peaks being ½ of the reference clock fr are observed. In FIG. 18, Na1, Na2, and Na3 represent first-order, second-order, and n-order delta-sigma $\Delta\Sigma$ modulation characteristics, respectively. Because fPLL is the closed loop characteristic of the PLL, low cutoff characteristics are indicated at loop band width fc.

Hence, the noise distributions modulated by fPLL, as indicated by Nb1 to Nb3, are greatly suppressed by the low cutoff characteristics of the PLL and the noise components generated in the quantizers can be reduced. Accordingly, the phase jump problem associated with the prior art can be mitigated greatly and can be prevented by selecting the reference clock fr and the loop band width fc of the PLL properly.

Noise in the PLL that is used to generate a spread spectrum clock is generated by the $\Delta\Sigma$ modulation-based quantizer, but such noise with its peak being at a frequency that is ½ of the input reference clock fr frequency can be suppressed by the loop band width fc of the PLL. It is desirable to set the loop band width of the PLL so that a modulating frequency for spread spectrum clock generation, for example, 30 kHz can pass, in order to ensure the clock spreading effect and reduce jitter components included in the generated clock. Hence, the loop band width fc of the PLL should be set broader than the band width of a signal that is spread and lower than a half of the frequency of the reference clock, based on the quantizer operates.

As is apparent from FIG. 18, by user a higher-order of $\Delta\Sigma$ quantizer, out-of-band noise can be suppressed more. By taking a control method in which the $\Delta\Sigma$ quantizer and the fractional divider are combined, it becomes possible to suppress peak spectrum occurrence that causes cycle-to-cycle jitters and EMI (Electro Magnetic Interference) problems that are important for clock generators.

Furthermore, in order to realize modulation with sine waves and random numbers, which is known as a clock generation method that can effectively suppress the EMI, by configuring the signal generator that modulates the clock frequency with elements to generate digital random numbers or a sine function of digital representation, it is possible to suppress the EMI without using an analog modulation means.

Thus, for the spread spectrum clock generator configured as described above, only the division number of the divider must be controlled, but highly precise analog circuits are not necessary.

EFFECTS OF THE INVENTION

The spread spectrum clock generator of the present invention prevents precipitous phase variations in the output high frequency clock fo and can suppress the occurrence of additional EMI components due to phase jump.

The spread spectrum clock generator of the present invention can be configured without using an analog modulator and a highly precise sine wave generator and can easily be integrated into a semiconductor chip in which relatively large digital circuits are integrated like a microprocessor. Accordingly, micro ICs as shown in FIG. 13 can be realized with the above clock generator and, in its possible application, a great number of sensors may be networked.

FIGS. 19 through 21 show results of spectrum analysis obtained by simulating the performance of the spread spectrum clock generator of the present invention. FIG. 19 shows the result of spectrum analysis for the clock generator employing a so-called "PN9" random signal generator; FIG. 20 shows the result of spectrum analysis for the clock generator employing a triangle wave signal generator; and FIG. 21 shows the result of spectrum analysis for the clock generator employing a sine wave signal generator.

In FIGS. 19 through 21, there are shown the results of two cases: (I) spectrum is spread; and (II) spectrum is not spread.

In these figures, the abscissa indicates signal frequency f [GHz] and the ordinate indicates output signal level [dBm]. Conditions of simulation: spread frequency width is 30 kHz and oscillation frequency is 1. 5 GHz. As is apparent from these figures, PN9 results in the most reduction in output level for spread frequencies, the triangle wave is the next, and the sine wave is the third. For the sine wave, the output level slightly rises at the edges of the spreading band, but has the EMI reduction effect as well as the PN9 and triangle wave.

Therefore, by applying the spread spectrum clock generator of the present invention to various types of clock generators, EMI reduction by 20-30 dB can be expected.

The spread spectrum clock generator of the present invention can be configured as a two-point modulation, spread spectrum clock generator like configuration examples shown in FIGS. 14 and 15. Thereby, it is possible to more broaden the frequency band width of a modulating signal for spread spectrum implementation and thus the EMI reduction effect can be enhanced more.

DETAILED DESCRIPTION OF THE PREFERRED EMBODIMENTS

Preferred embodiments of the present invention will be described in detail hereinafter with reference to the accompanying drawings.

Embodiment 1

Figure 1:
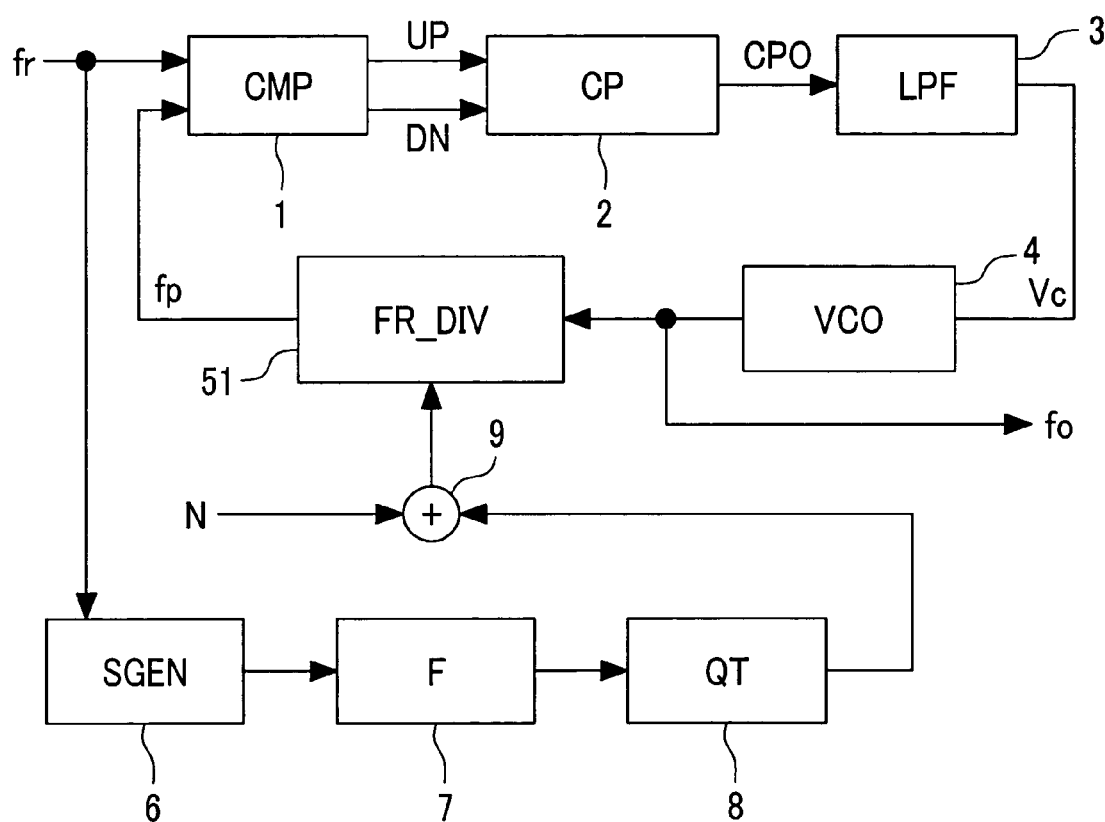
FIG. 1 is a structural diagram of a spread spectrum clock generator according to the present invention.

A first preferred embodiment of the present invention is discussed, using FIGS. 1 through 10. FIG. 1 is a basic structural diagram of a spread spectrum clock generator according to the present invention. The spread spectrum clock generator is made up of a phase comparator 1, a charge pump 2, a loop filter 3, a VCO 4, a fractional divider (FR_DIV) 51, a signal generator 6, a filter 7, a quantizer 8, and an adder 9. In this configuration, the quantizer 8 output and an average division number N are added and a signal having a value obtained by the addition is used to control a division number of the fractional divider 51.

The phase comparator 1 detects a phase difference between the reference clock fr and the output fp of the fractional divider 51 and outputs a control signal UP or DN. Here, the control signal UP increases the oscillation frequency of the following VCO 4 and the DN signal decreases the oscillation frequency. The two control signals (UP, DN) that are output from the phase comparator 1 have a pulse width corresponding to the phase difference between the reference clock fr and the output fp of the fractional divider 51.

The control signal UP or DN output from the phase comparator 1 is converted from a pulse width signal to a voltage signal CPO by the charge pump 2. The charge pump is a one-bit DA (digital to analog) converter. The output signal CPO of the charge pump 2 is charged or discharged, corresponding to the UP or DN signal pulse width, through the following loop filter 3. The loop filter 3 determines a loop band width fc and consists of serial RC (resistor and capacitor) circuits.

The output Vc of the loop filter 3 is supplied to the VCO 4. Here, the VCO 4 generates an oscillation frequency that can be varied by the control voltage Vc and the use of a simple structure, ring oscillator type VCO is suitable for this embodiment. However, as the VCO, an LC resonance circuit type providing a high frequency stability can be used.

In the above description, the phase comparator 1, charge pump 2, loop filter 3, and VCO 4 implementations are well known and, therefore, detailed description of these circuits is omitted.

The output of the VCO 4 is input to the fractional divider 51 and becomes an input signal fp to the phase comparator 1. As the fractional divider 51, a variable divider configured to be capable of changing the division number per cycle of the reference clock fr may be used.

A PLL of this embodiment consists of the above elements and can generate a high-frequency clock scaled up by N times the average division number of the fractional divider 51 with regard to the reference clock fr.

Next, a portion for controlling the division number of the fractional divider 51 is discussed.

The control block for the division number of the fractional divider 51 consists of the signal generator (SGEN) 6, filter (F) 7, and quantizer (QT) 8. The division number of the fractional divider 51 is controlled by a value obtained by adding the quantizer 8 output and the average division number N by the adder 9.

Figure 2:
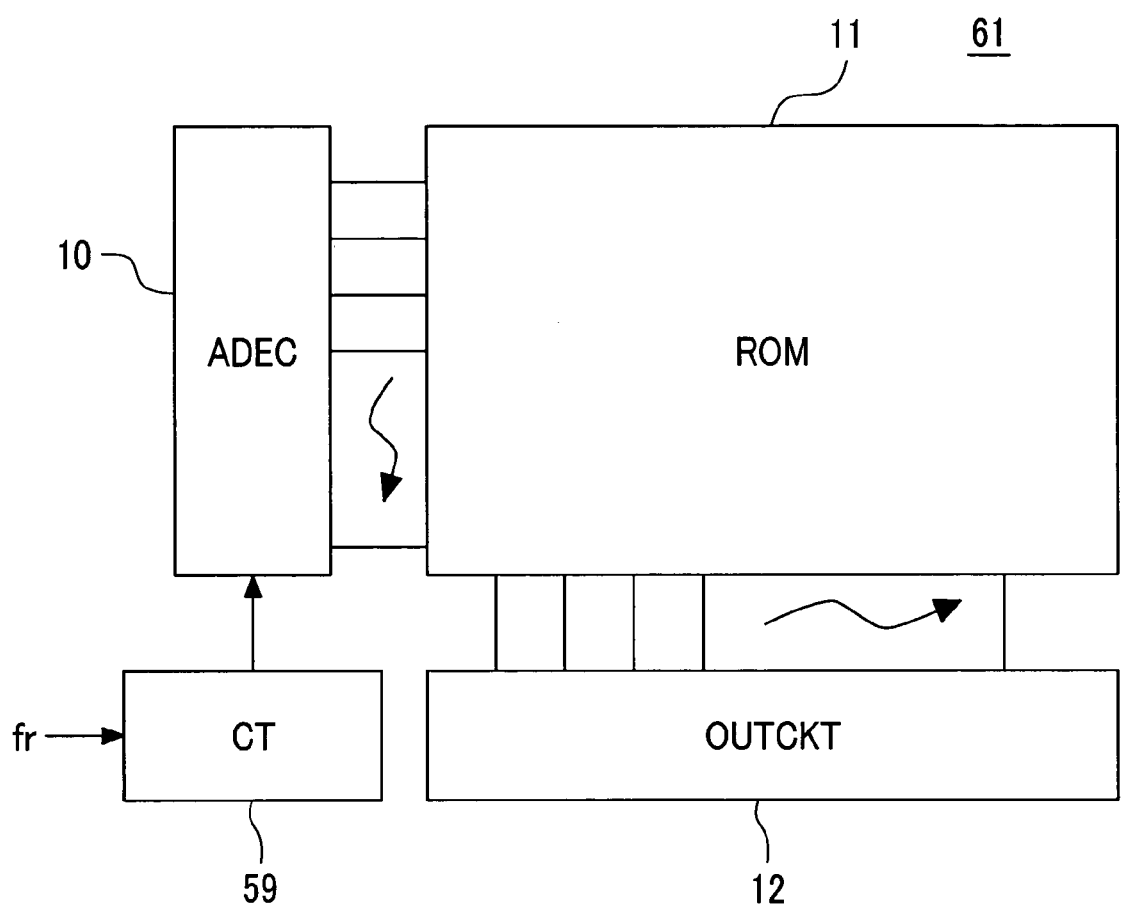
FIG. 2 is a diagram showing a first configuration example of a signal generator which is employed in the clock generator of FIG. 1.

The signal generator 6 outputs a spread waveform represented in digital values. FIG. 2 shows a sine wave generator 61 as a first configuration example of the signal generator 6. The sine wave generator 61 is made up of a counter (CT) 59, an address decoder (ADEC) 10, a ROM (Read Only Memory) 11, and an output circuit (OUTCKT) 12. Here, the sine wave generator 61 shown in FIG. 2 has been configured to receive an input of the reference clock fr and operate, based on the clock fr as the clock signal for the counter 59. However, a clock supplied from another clock source, which is asynchronous with the reference clock fr, may be used, if a means for correcting a phase shift, such as a FIFO (First in First out) entity, is introduced in the section from the sine wave generator 61 to the adder 9. In the following description, therefore, it is assumed that the reference clock fr is used.

The reference clock fr input to the signal generator 6 is counted by the counter 59. The output of the counter 59 is input to the address decoder 10 and appropriate data is selected from the ROM 11, according to the address corresponding to the count value of the counter 59. The output circuit 12 selectively retrieves the data from the ROM 11 and outputs that data to the following filter circuit. Here, the ROM 11 is configured to retain a sine function so that a sine wave of digital representation can be output.

This sine wave generator 61 can generate several types of spread waveforms by storing data representing a triangle wave and any other function into the ROM 11.

Figure 3:
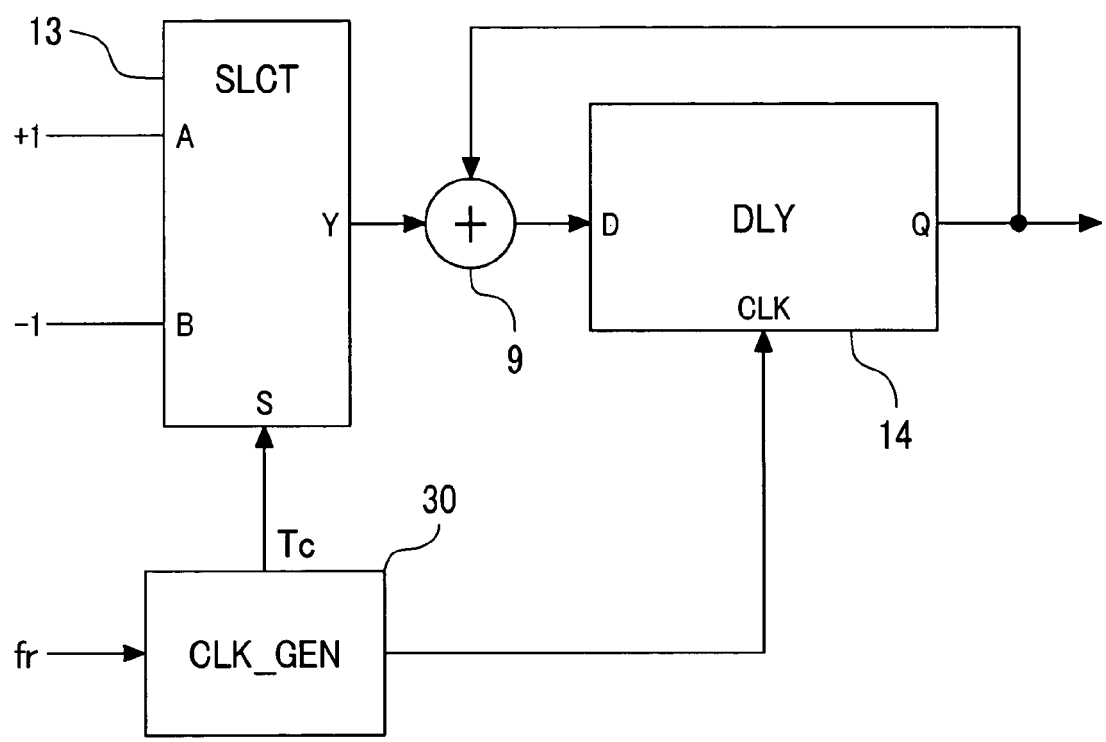
FIG. 3 is a diagram showing a second configuration example of the signal generator which is employed in the clock generator of FIG. 1.

FIG. 3 shows a triangle wave generator 61 as a second configuration example of the signal generator 6. The triangle wave generator is made up of a selector (SLCT) 13 for selecting a value of +1 or −1, a delay element (DLY) 14 which retains a clock value in sync with the reference clock fr, an adder 9 which adds the delay element 14 output and the selector output, and a clock generator (CLK_GEN) 30, wherein the output of the adder 9 is input to the delay element 13.

The clock generator 30 generates from the reference clock fr a clock Tc that determines a cycle required for the triangle wave generator 61 to operate and supplies the clock Tc to the selector 13. It is assumed that, from the output terminal Y of the selector 13, data input at terminal A is output when the input at terminal S=1 and data input at terminal B is output when the input at terminal S=0.

During a period when Tc=1 is output from the clock generator 30, the Y output is +1 and a digital integrator consisting of the following adder 9 and delay element 14 is incremented by one. Inversely, during a period when Tc=0 is output from the clock generator 30, the Y output is −1 and the digital integrator consisting of the following adder 9 and delay element 14 is decremented by one. By this operation, ascending and descending digital data corresponding to the 1 and 0 of Tc can be generated and, therefore, a triangle wave of digital representation corresponding to the cycle of Tc can be generated.

Figure 4:
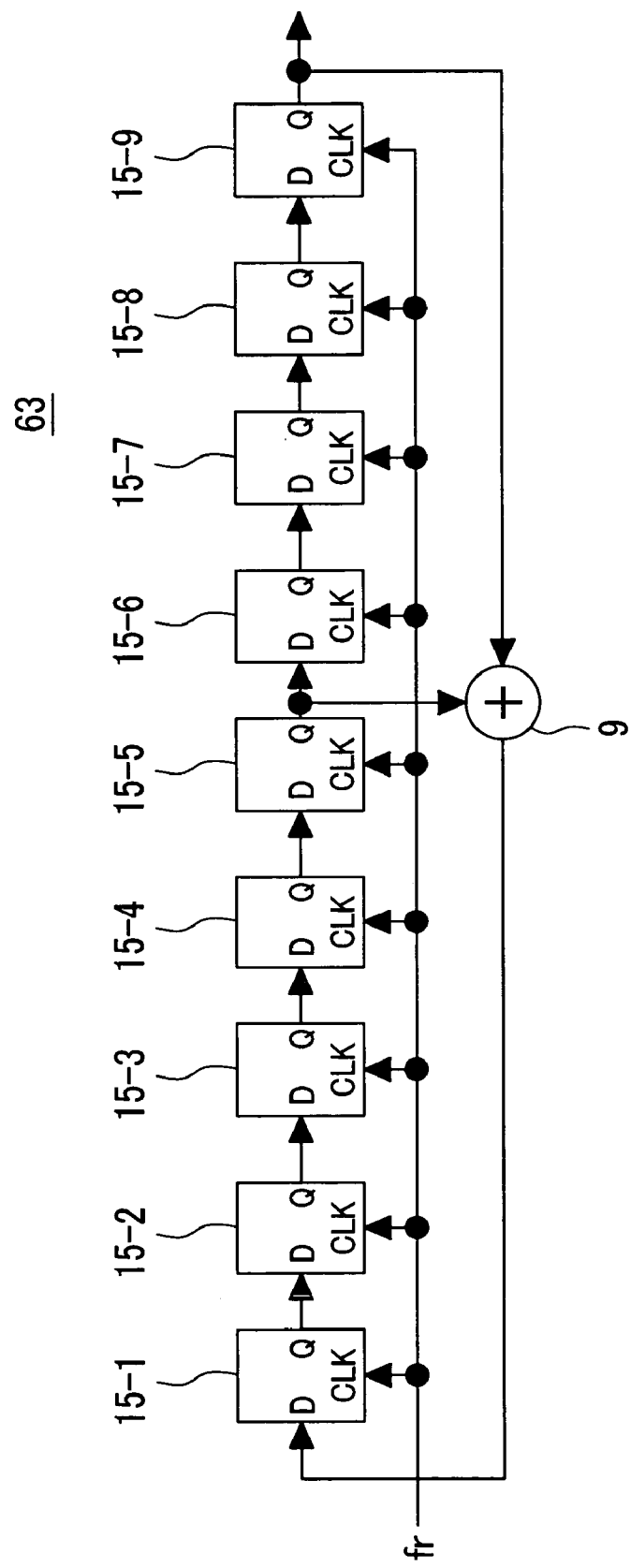
FIG. 4 is a diagram showing a third configuration example of the signal generator which is employed in the clock generator of FIG. 1.

FIG. 4 shows a random numbers generator 63 configuration to generate random numbers as a third configuration example of the signal generator 6. FIG. 4 depicts circuitry to generate random numbers called PN9. The random numbers generator 63 is made up of nine stages of delay elements 15-1 through 15-9 cascaded to constitute a shift register and an adder 9, wherein the output of the fifth-stage delay element 15-5 and the output of the ninth stage delay element 15-9 of the cascaded delay elements are input to the adder 9 and the output of the adder 9 is input to the first-stage delay element 15-1.

Here, the adder 9 can be configured by way of an exclusive OR (XOR) entity. The reference clock fr is used as a clock to shift the delay elements 15-1 through 15-9 cascaded to constitute the shift register. However, this configuration can be made easily even if another clock is selected to shift the delay elements and, therefore, a clock other than the reference clock fr can be used. The random numbers are not limited to PN9 and the number of stages of the delay elements can be increased to, for example, 15 stages, 23 stages, or more, so that random numbers of less periodicity can be generated.

Next, configuration examples of the filter 7 included in FIG. 1 are discussed. The filter 7 is provided to cut off the high-frequency component of noise included in the output of the signal generator 6 and a plurality of modes of its configuration can be applied. Although two types of the configuration which are regarded as having a higher noise cutoff effect are described below, other types of the configuration may be used without a problem if the frequency characteristics required for the filter can be achieved.

Figure 5:
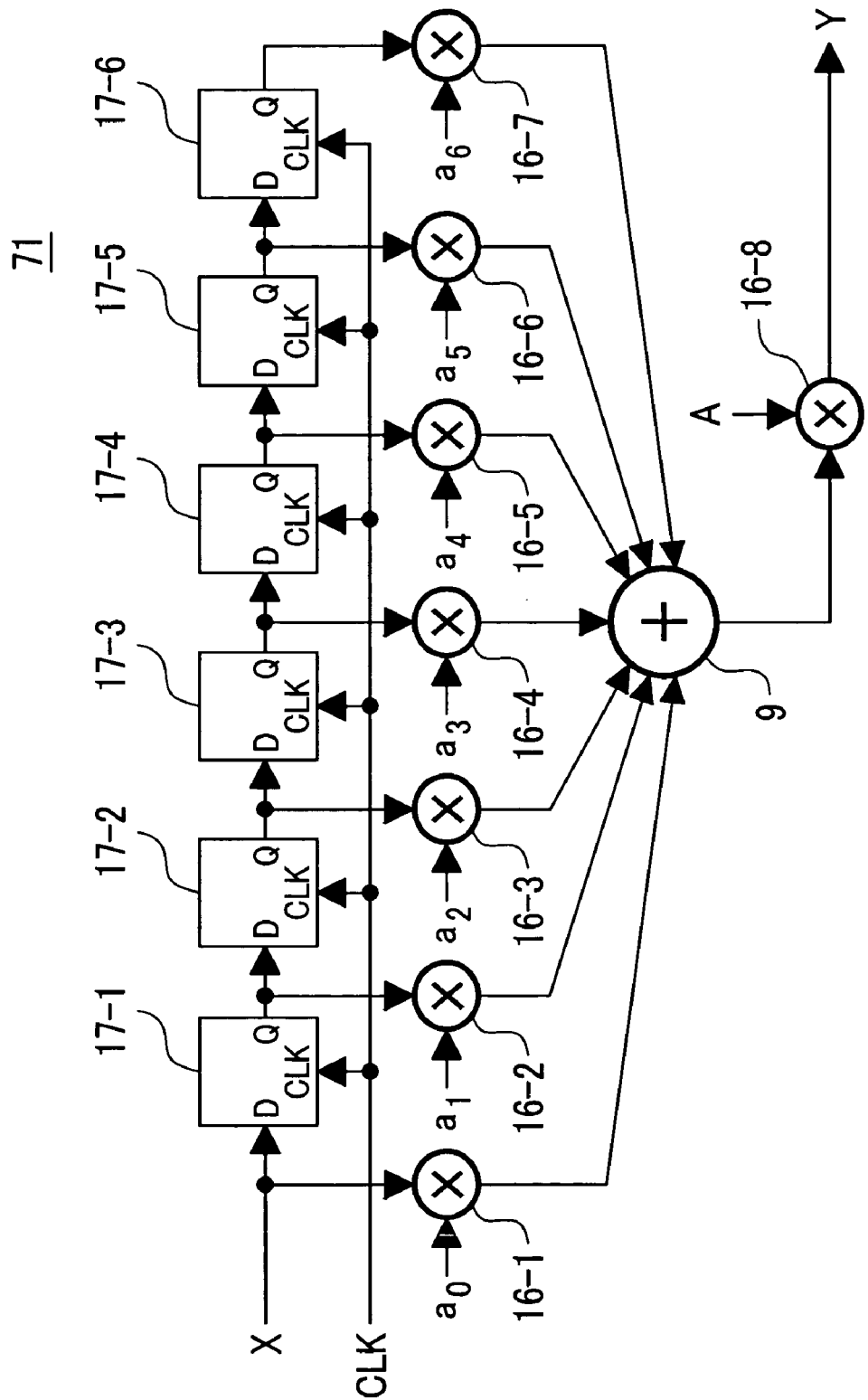
FIG. 5 is a diagram showing a first configuration example of a filter which is employed in the clock generator of FIG. 1.

FIG. 5 shows a FIR (Finite Impulse Response) type filter configuration as a first configuration example of th filter 7. The FIR filter 71 is made up of delay elements 17-1 through 17-6 cascaded to constitute a shift register which receives an input from an input terminal X, multipliers 16-2 through 16-7 to which the outputs of the delay elements 17-1 through 17-6 are connected, a multiplier 16-1 connected to the input terminal X, an adder 9 to which the outputs of the multipliers 16-1 through 16-7 are input, and a multiplier 16-8 connected to the output of the adder 9 to multiply the adder output by an arbitrary factor of A. In the above configuration, although factors a0 through a7 of the multipliers 16-1 through 16-7 can be selected arbitrarily, it may be preferable to use a commonly well-known gauss function to select the factors. By using the factors based on the gauss function, th filter with good cutoff frequency characteristics can be configured.

The factor A is a parameter in determining the filter gain and, by varying this value, the filter with an arbitrary band width of the spread spectrum can be realized. Although the FIR filter 71 has six stages of delay elements in this example, an arbitrary number of stages of delay elements can be set up to adjust the cutoff frequency characteristics. The reference clock fr or a clock with a divided frequency of the reference clock may be used as a clock, based on which the shift register operates. For an alternative arrangement, it is possible to supply a clock from another clock source different from the reference clock fr, and, in this case, a phase shift correction circuit such as a FIFO entity must be provided in the section after the filter output.

Figure 6:
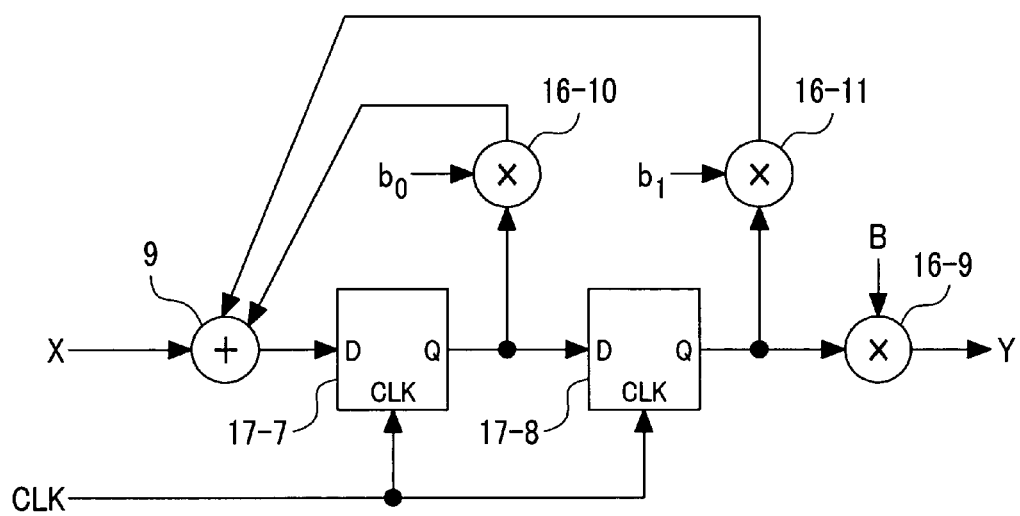
FIG. 6 is a diagram showing a second configuration example of the filter which is employed in the clock generator of FIG. 1.

A second configuration example of the filter 7 is discussed, using FIG. 6. FIG. 6 shows an example of an IIR (Infinite Impulse Response) type filter. The IIR filter 72 is made up of an adder 9 connected to an input terminal X, delay elements 17-7, 17-8 cascaded to constitute a shift register, multipliers 16-10, 16-11 connected to the outputs of the delay elements 17-7, 17-8, and a multiplier 16-9 connected to the output of the delay element 17-8 to multiply the delay element output by an arbitrary factor of B, wherein the outputs of the multipliers 16-10, 16-11 are connected to the adder 9.

The IIR filter 72 is a feedback circuit in which the delay elements 17-7, 17-8 receive an input from the input terminal X, their outputs are multiplied by factors b0 and b1, respectively, the results of the multiplication are input to the adder 9 again. By properly selecting the factors b0 and b1, a low pass filter can be configured. The factors must be selected, taking stability into consideration.

As is the case for the FIR filter 71, the factor B is a parameter in determining the filter gain and, by varying this value, the filter with an arbitrary band width of the spread spectrum can be realized. Although the IIR filter has two stages of delay elements in this example, an arbitrary number of stages of delay elements can be set up to adjust the cutoff frequency characteristics. As for the clock, based on which the shift register operates, the reference clock fr or a clock with a divided frequency of the reference clock may be used, as is the case for the FIR filter. For an alternative arrangement, it is possible to supply a clock from another clock source different from the reference clock fr, and, in this case, a phase shift correction circuit such as a FIFO entity must be provided in the section after the filter output.

Next, the quantizer 8 included in FIG. 1 is discussed. The quantizer 8 is a circuit with functions to convert non-integral values output from the filter 7 to integers and equalize an average of the output integers to an average of the output values of the filter 7. Such technique is widely applied in DA converters and the quantizer configuration is discussed, using several examples.

Figure 7:
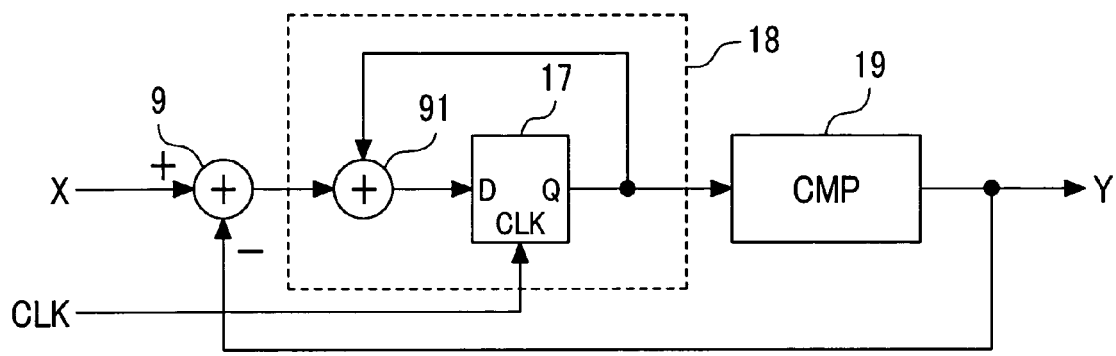
FIG. 7 is a diagram showing a first configuration example of a quantizer which is employed in the clock generator of FIG. 1.

FIG. 7 shows a first-order delta-sigma $\Delta\Sigma$ type quantizer as a first quantizer configuration example. This quantizer 81 is made up of an adder 9 connected to an input terminal X, another adder 91 to which the output of the adder 9 is input, a delay element 17 to which the output of the adder 91 is connected, and a comparator (CMP) 19 to which the output of the delay element 17 is connected. The output of the comparator 19 is output from the output terminal Y of the quantizer 81 and also fed back to another input of the adder 9. The circuitry is formed so that the output of the delay element 17 is fed back to the adder 91.

Subtraction between a digital signal input from the input terminal X and an output value of the comparator 19 is performed by the adder 9. Here, because the subtraction operation consists of a polarity inversion and an addition, it is symbolized as the same operation that is performed by an adder. The output of the adder 9 is input to an integrator 18 consisting of the delay element 17 and the adder 91, where integration is performed. The comparator 19 judges whether an output value of the integrator 18 is greater than or equal to 0 or less than 0. A feedback loop is formed to feed back the result of the judgment to the above adder 9 as an input signal.

By way of the above-described configuration, a digital signal containing a value having a fractional part from the input terminal X can be output as an integer to the output terminal Y. By feeding back the output of the comparator 19 to the adder 9, an average of values output at the output terminal Y can be equalized to an average of values input at the input terminal X. Thus, the first-order delta-sigma $\Delta\Sigma$ type quantizer 81 as the first configuration example of the quantizer 8 included in FIG. 1 is capable of converting a digital value including a factional part to an integer and maintaining an average.

Figure 18:
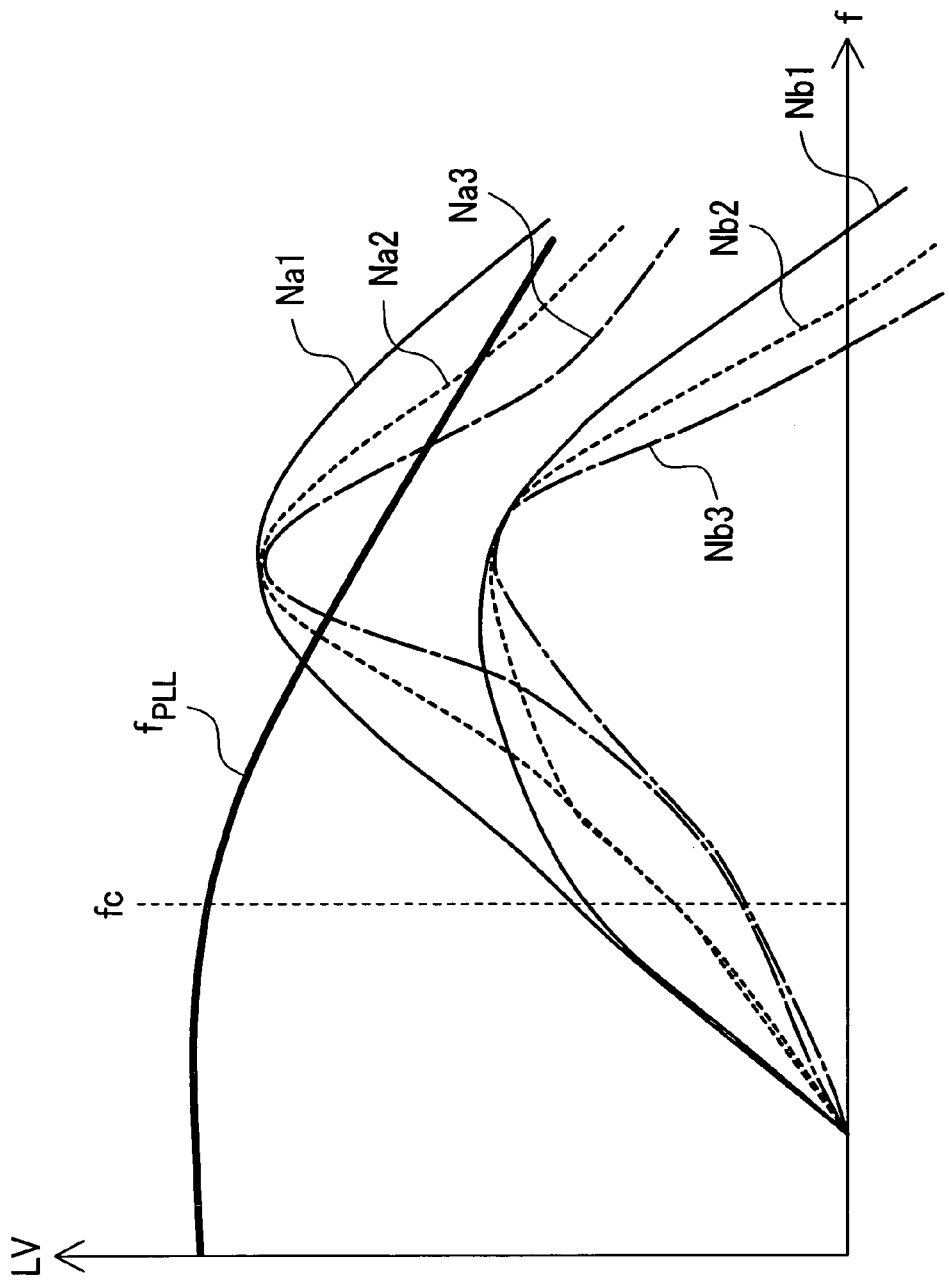
FIG. 18 shows graphic representations of noise vs. loop band width relationships for spread spectrum clock generator embodiment variants according to the present invention.
Figure 19:
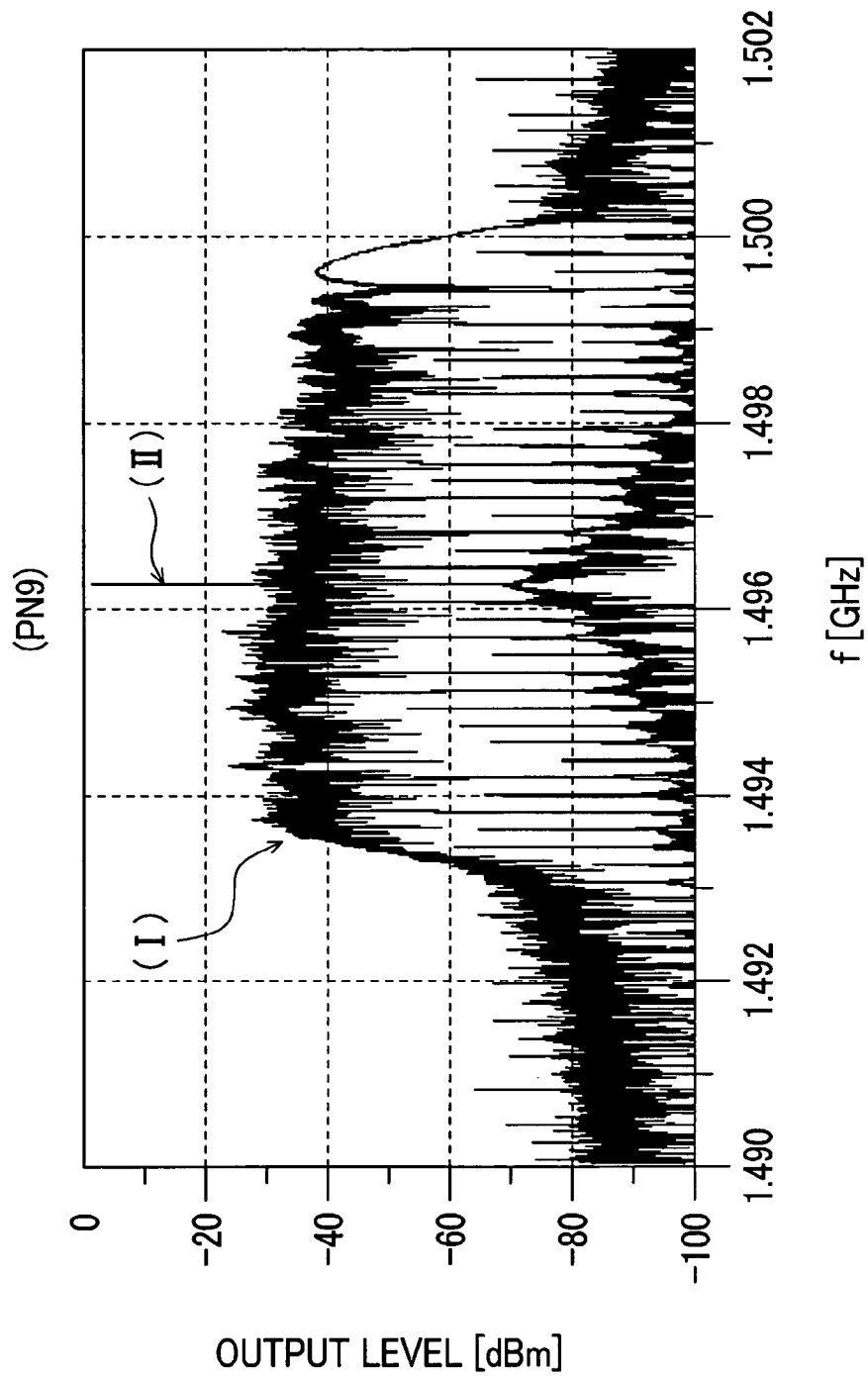
FIG. 19 is a graph showing the result of spectrum analysis obtained by simulating the performance of the spread spectrum clock generator employing a random signal generator according to the present invention.
Figure 20:
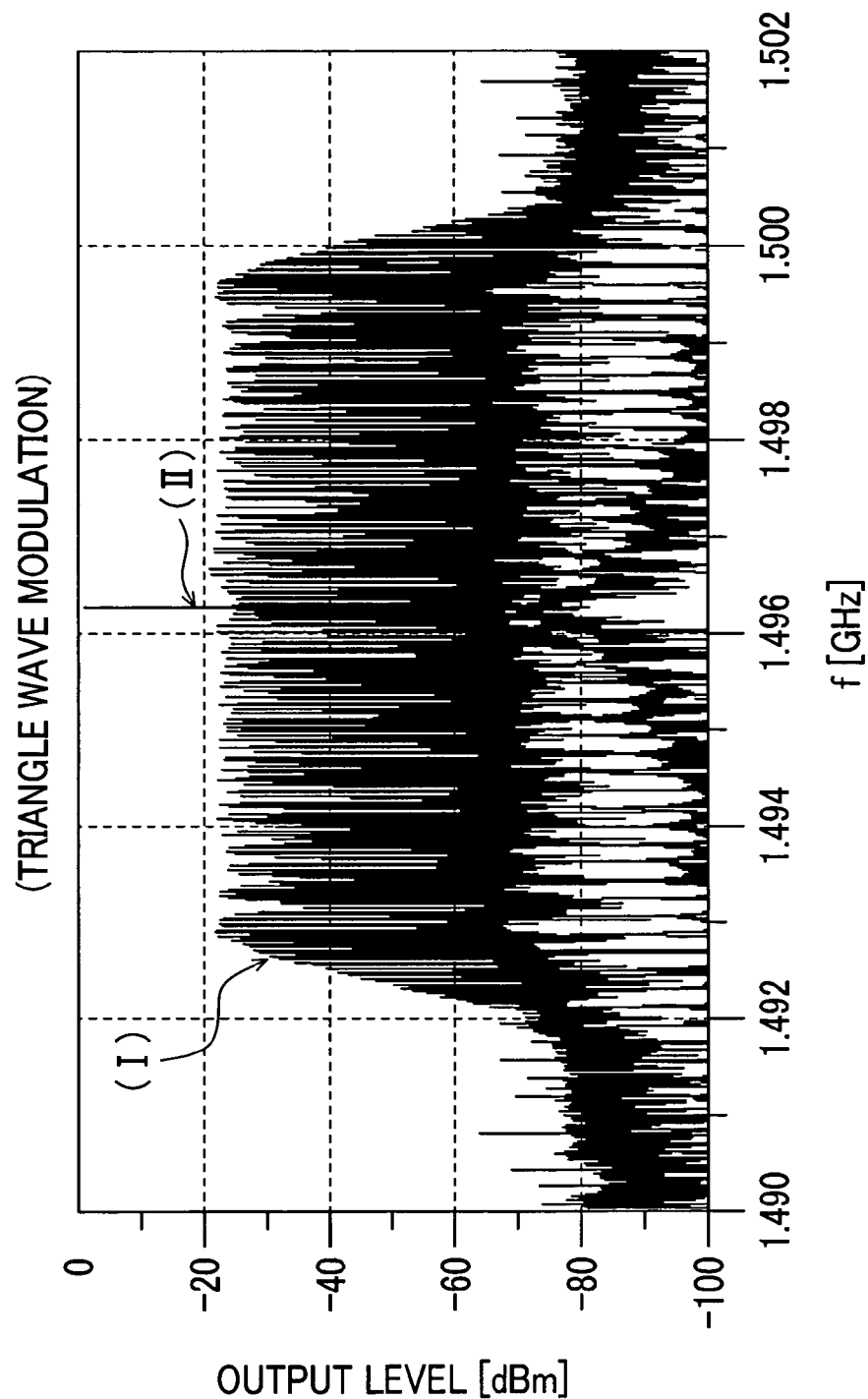
FIG. 20 is a graph showing the result of spectrum analysis obtained by simulating the performance of the spread spectrum clock generator employing a triangle wave signal generator according to the present invention.
Figure 21:
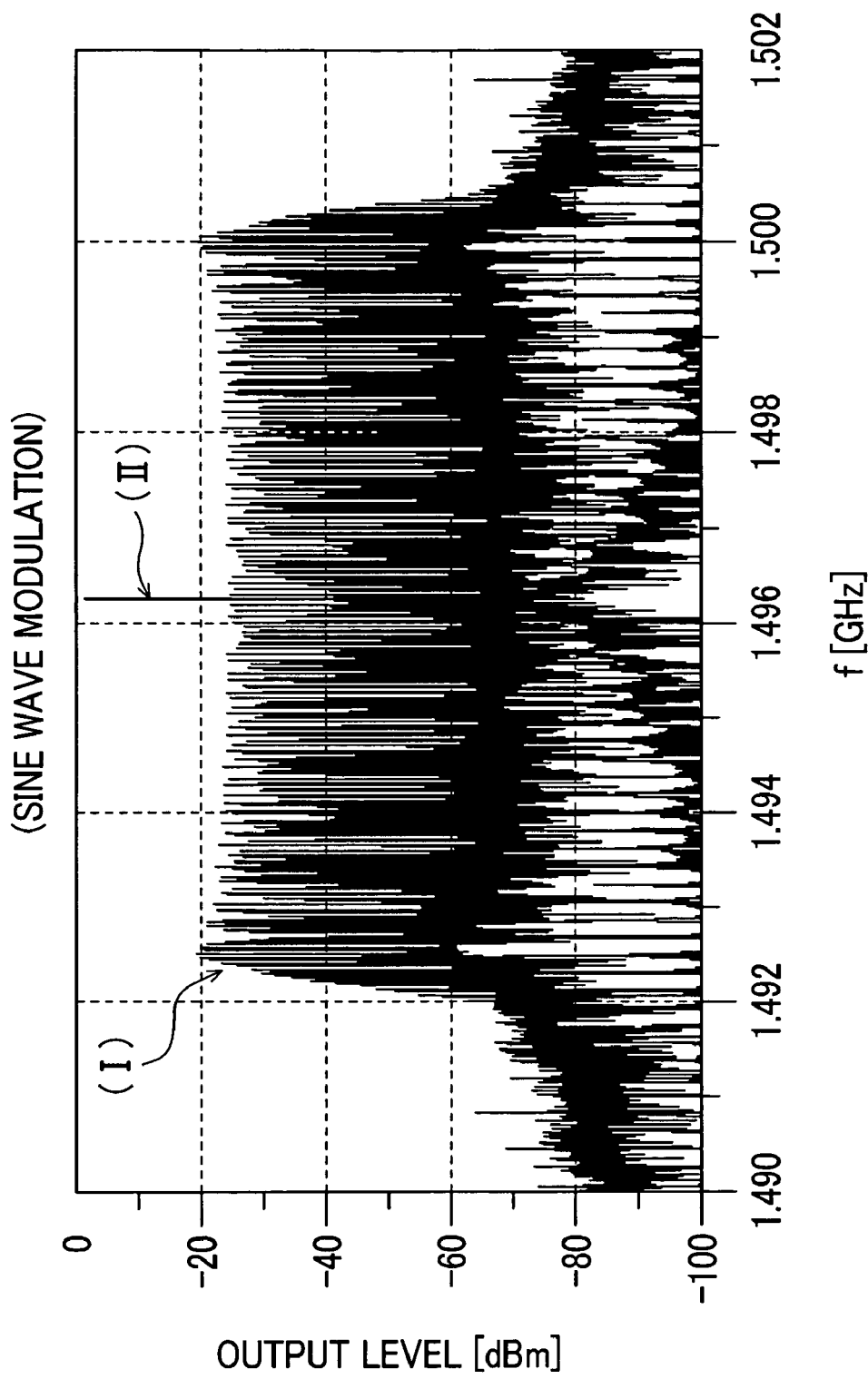
FIG. 21 is a graph showing the result of spectrum analysis obtained by simulating the performance of the spread spectrum clock generator employing a sine wave signal generator according to the present invention.

Noise distribution when the quantizer 81 of FIG. 7 is used can be represented by a function of $1-z^{-1}$ and its graphic representation Na1 is shown in FIG. 18.

Figure 8:
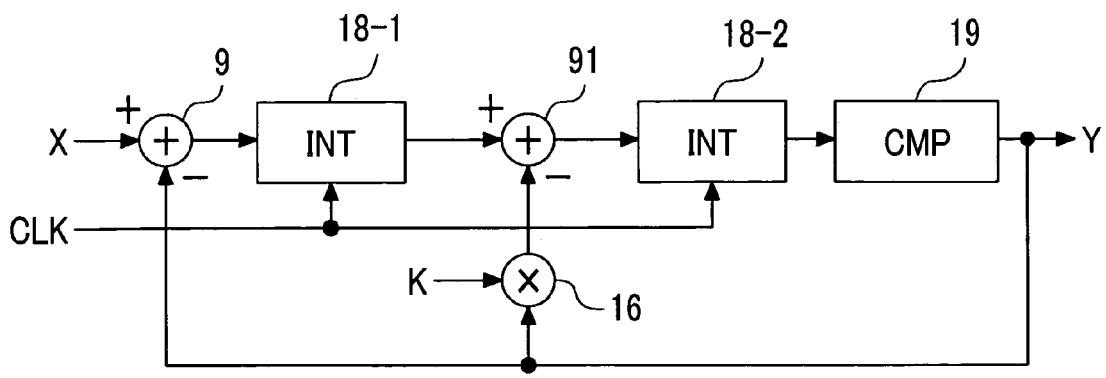
FIG. 8 is a diagram showing a second configuration example of the quantizer which is employed in the clock generator of FIG. 1.

FIG. 8 shows a second-order delta-sigma $\Delta\Sigma$ type quantizer as a second quantizer configuration example. This quantizer 82 is made up of an adder connected to an input terminal X, an integrator (INT) 18-1 connected to the output of the adder 9, an adder 91 connected to the output of the integrator 18-1, an integrator 18-2 connected to the output of the adder 91, a comparator 19 connected to the output of the integrator 18-2, and a multiplier 16 connected to the output of the comparator 19. The output of the comparator 19 is connected to the quantizer 82 output terminal Y and also fed back to another input of the adder 9. The output of the multiplier 16 is input to another input of the adder 91 and an arbitrary factor of K is input to another input of the multiplier 16.

Here, the integrators 18-1 and 18-2 have the same structure as the integrator 18 shown in FIG. 7. For the arbitrary factor of K, although any value can be assigned if it stabilizes the second-order delta-sigma $\Delta\Sigma$ feedback loop, it is commonly known that K=2 ensures the stability and, therefore, K=2 is used in this example.

Then, the operation of the second-order delta-sigma $\Delta\Sigma$ type quantizer 82 is described.

Subtraction between a digital signal input from the input terminal X and an output value of the comparator 19 is performed by the adder 9. The output of the adder 9 is input to the integrator 18-1 where integration is performed. The output of the integrator 18-1 is supplied to the adder 91 where subtraction between the integrator output and the output value of the comparator 19 multiplied by the factor of K is performed. The output of the adder 91 is supplied via the integrator 18-2 to the comparator 19 and the comparator 19 judges whether the integrator 18-2 output value is greater than or equal to 0 or less than 0. The result of the judgment is fed back to the adder 9 as an input signal and to the multiplier 16 as an input signal. Because the feedback loop is formed via two integrators in this configuration, this circuitry is called the second-order delta-sigma $\Delta\Sigma$ type.

By way of the above-described configuration, a digital signal containing a value having a fractional part from the input terminal X can be output as an integer to the output terminal Y. By feeding back the output of the comparator 19 to the adder 9 and the adder 91, an average of values output at the output terminal Y can be equalized to an average of values input at the input terminal X. Thus, the second-order delta-sigma $\Delta\Sigma$ type quantizer 82 as the second configuration example of the quantizer 8 included in FIG. 1 is capable of converting a digital value including a factional part to an integer and maintaining an average. Moreover, noise distribution when the quantizer configuration of FIG. 8 is used can be represented by a function of $(1-z^{-1})^2$.

Figure 9:
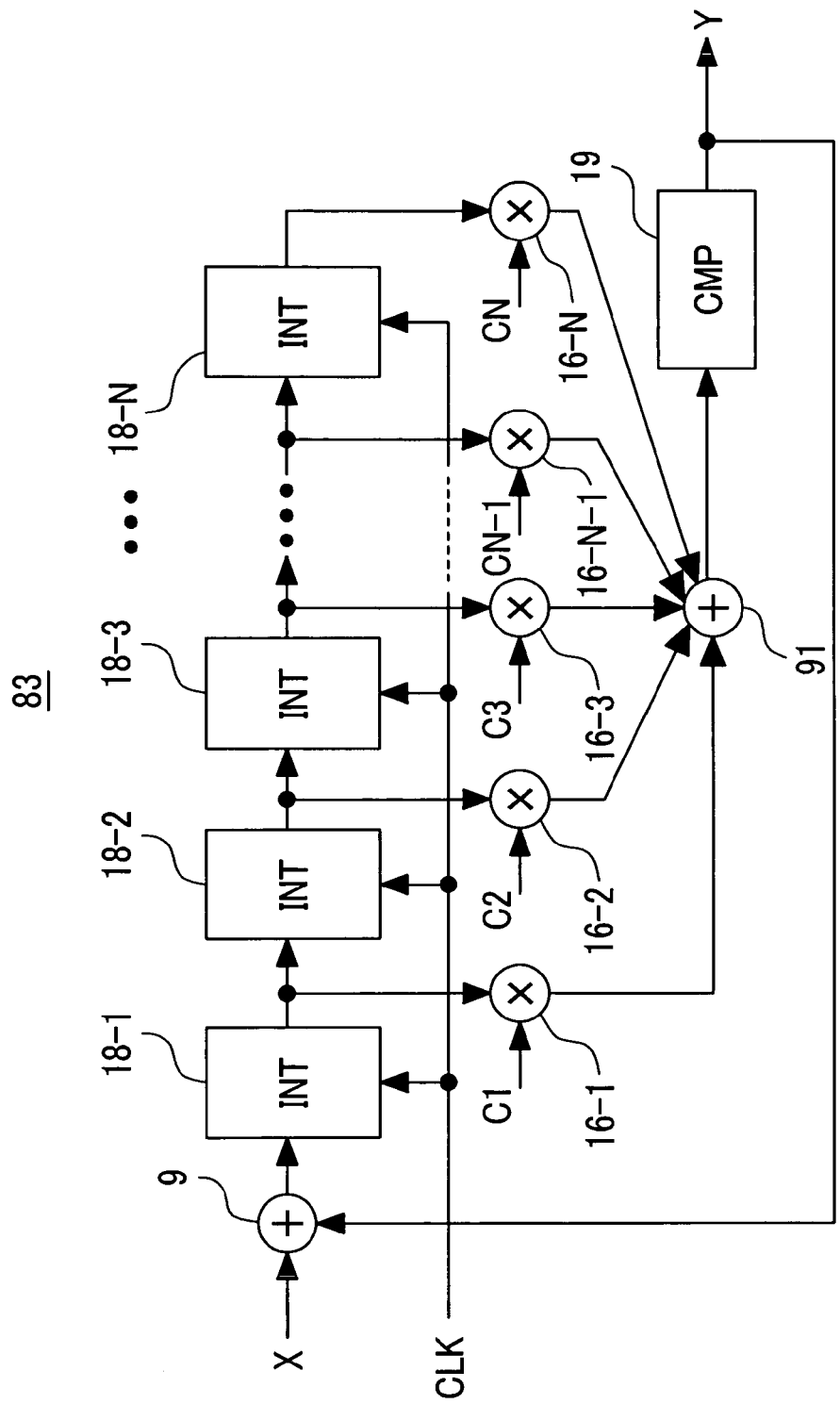
FIG. 9 is a diagram showing a third configuration example of the quantizer which is employed in the clock generator of FIG. 1.

Next, FIG. 9 shows an n-order delta-sigma $\Delta\Sigma$ type quantizer as a third quantizer configuration example. This quantizer 83 is made up of an adder 9 connected to an input terminal X, integrators 18-1 through 18-N cascaded to the output of the adder 9, multipliers 16-1 through 16-N respectively connected to the outputs of the integrators 18-1 through 18-N, an adder 91 to which the outputs of the multipliers 16-1 through 16-N are connected, and a comparator 19 to which the output of the adder 91 is connected. The output of the comparator 19 is connected to the output terminal Y of the quantizer 83 and also fed back to another input of the adder 9.

Here, arbitrary factors of C1 through CN are respectively input to the other inputs of the multipliers 16-1 through 16-N. Values to be assigned to the factors C1 through CN may be selected to ensure the stability of the feedback loop.

Then, the operation of the n-order delta-sigma $\Delta\Sigma$ type quantizer 83 is described.

Subtraction between a digital signal input from the input terminal X and an output value of the comparator 19 is performed by the adder 9. The output of the adder 9 is input to the cascaded integrators 18-1 through 18-N. The outputs of the integrators 18-1 through 18-N are connected to the multipliers with different factors, as shown in FIG. 9, and, eventually the outputs of the multipliers are combined into a single signal in the adder 91. The output of the adder 91 is supplied to the comparator 19 and the comparator 19 judges whether the adder 91 output value is greater than or equal to 0 or less than 0. The result of the judgment is fed back to the adder 9 as an input signal. Because the feedback loop is formed via n pieces of integrators in this configuration, this circuitry is called the n-order delta-sigma $\Delta\Sigma$ type.

By way of the above-described configuration, a digital signal containing a value having a fractional part from the input terminal X can be output as an integer to the output terminal Y. By feeding back the output of the comparator 19 to the adder 9, an average of values output at the output terminal Y can be equalized to an average of values input at the input terminal X. Thus, the n-order delta-sigma $\Delta\Sigma$ type quantizer 83 as the third configuration example of the quantizer 8 included in FIG. 1 is capable of converting a digital value including a factional part to an integer and maintaining an average. Moreover, noise distribution when the quantizer configuration of FIG. 9 is used can be represented by a function of $(1-z^{-1})^N$.

Figure 10:
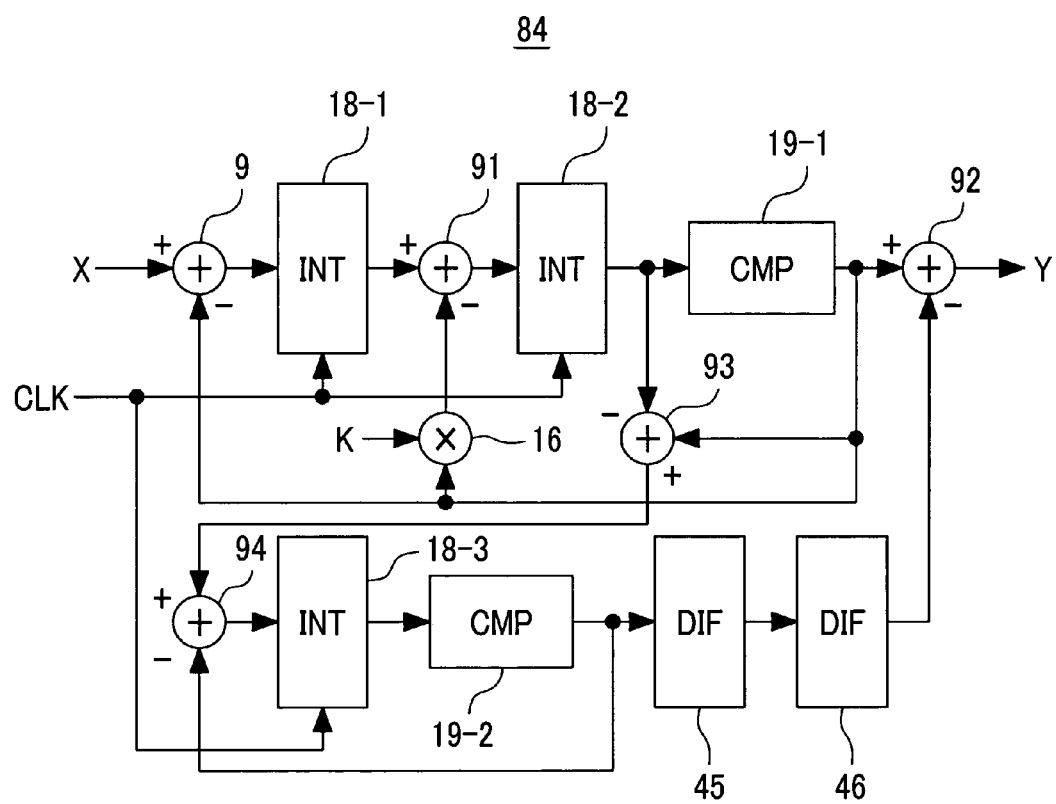
FIG. 10 is a diagram showing a fourth configuration example of the quantizer which is employed in the clock generator of FIG. 1.

Next, FIG. 10 shows a cascaded type quantizer as a fourth quantizer configuration example. This quantizer 84 is made up of an adder 9 connected to an input terminal X, an integrator 18-1 connected to the output of the adder 9, an adder 91 connected to the output of the integrator 18-1, an integrator 18-2 connected to the output of the adder 91, a comparator 19-1 connected to the output of the integrator 18-2, a multiplier 16 connected to the output of the comparator 19-1, an adder 93 which performs subtraction between the output and input values of the comparator 19-1, an adder 94 connected to the output of the adder 93, an integrator 18-3 connected to the output of the adder 94, a comparator 19-2 connected to the output of the integrator 18-3, a subtractor (DIF) 45 connected to the output of the comparator 19-2, a subtractor 46 connected to the output of the subtractor 45, and an adder 92 connected to the output of the comparator 19-1 and the output of the subtractor 46. The output of the comparator 19-1 is input to another input of the adder 9, the output of the comparator 19-2 is input to another input of the adder 94, and the output of the multiplier 16 is input to another input of the adder 91. Furthermore, the quantizer is configured such that an arbitrary factor of K is input to another input of the multiplier 16 and the output of the adder 92 becomes the output of the quantizer 84. Here, the integrators 18-1 through 18-3 have the same structure as the integrator 18-1 shown in FIG. 7 and K=2 is used for the arbitrary factor of K, as is the case for the second-order delta-sigma ΔΣ type quantizer example.

Then, the operation of the cascaded type quantizer 84 is described.

Subtraction between a digital signal input from the input terminal X and an output value of the comparator 19-1 is performed by the adder 9. The output of the adder 9 is input to the integrator 18-1 where integration is performed. The output of the integrator 18-1 is supplied to the adder 91 where subtraction between the integrator output and the output of the comparator 19-1 multiplied by the factor of K is performed. The output of the adder 91 is supplied via the integrator 18-2 to the comparator 19-1 and the comparator 19-1 judges whether the integrator 18-2 output value is greater than or equal to 0 or less than 0. The result of the judgment is fed back to the adder 9 as an input signal and the multiplier 16 as an input signal. As concerns the configuration described hereinbefore, it is identical to the circuitry called the second-order delta-sigma ΔΣ type, because the feedback loop is formed via the two integrators 18-1 and 18-2. Then, subtraction between an output value of the comparator 19-1 and an output value of the integrator 18-2 is performed by the adder 93 and, thus, an error of the second-order delta-sigma ΔΣ operation is recalculated.

The output of the adder 93 is input to the adder 94 where subtraction between an output value of the adder 93 and an output value of the comparator 19-2 is then performed. The output of the adder 94 is input to the integrator 18-3 where integration is performed. The above comparator 19-2 judges whether the output value of the integrator 18-3 is greater than or equal to 0 or less than 0. The output of the comparator 19-2 is fed back to another input of the above adder 94 and thereby a different feedback loop from the above second-order delta-sigma ΔΣ one is formed. The feedback loop thus formed of the adder 94, integrator 18-3, and comparator 19-2 is equivalent to the first-order delta-sigma ΔΣ circuitry shown in FIG. 7 and can generate noise distribution represented by the function $(1-z^{-1})$.

The output of the comparator 19-2, after passing through the two subtractors 41 and 42, is added to the output of the comparator 19-1. By feeding forward the thus manipulated error to the second-order delta-sigma ΔΣ block, the error can be compensated and noise distribution corresponding to $(1-z^{-1})^3$ can be realized as total characteristics.

Hence, by way of the above-described configuration, a digital signal containing a value having a fractional part from the input terminal X can be output as an integer to the output terminal Y. By feeding back the output of the comparator 19-1 to the adder 9, an average of values output at the output terminal Y can be equalized to an average of values input at the input terminal X, as is the case for the second-order delta-sigma ΔΣ type quantizer. Likewise, the cascaded type quantizer as an example of the quantizer 8 is capable of converting a digital value including a factional part to an integer and maintaining an average. Moreover, noise distribution when the quantizer configuration of FIG. 10 is used can be represented by a function of $(1-z^{-1})^3$.

As discussed above, the spread spectrum clock generator according to the present invention having the basic structure shown in FIG. 1 is capable of yielding a waveform of an arbitrary function which can be represented in digital values, such as a sine wave, random number, and triangle wave, by way of the signal generator 6, filter 7, quantizer 8, and the adder 9 that adds an average division number, and is also capable of rounding decimal numbers to integers by using delta-sigma ΔΣ circuitry. These capabilities can be achieved without introducing noise that causes a phase jump.

Embodiment 2

Figure 11:
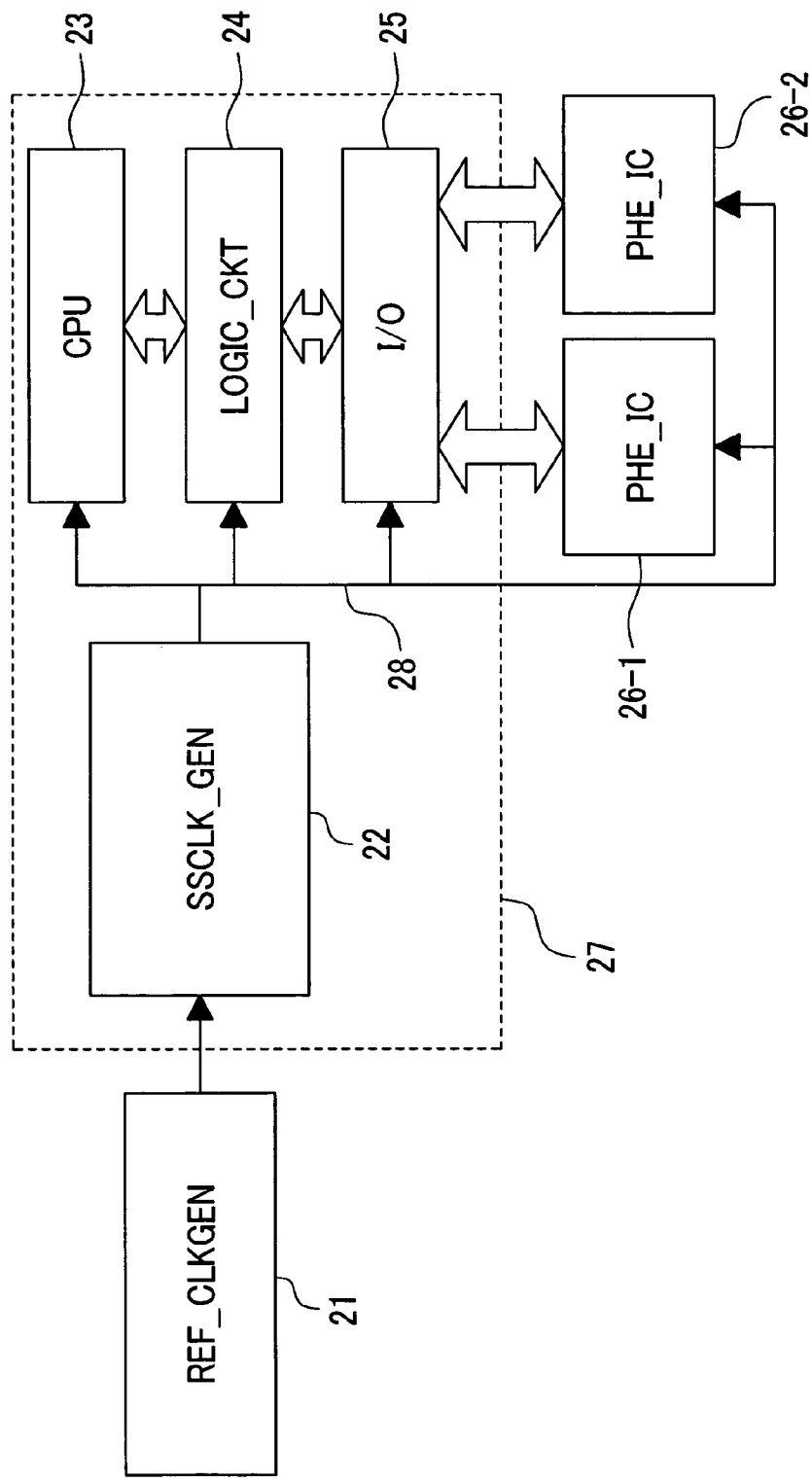
FIG. 11 is a diagram showing an example of application of the spread spectrum clock generator according to the present invention.

Next, a second preferred embodiment of the present invention is discussed. FIG. 11 is a structural diagram of a device in which the spread spectrum clock generator according to the present invention described in the Embodiment 1 section, using FIGS. 1 through 10 is applied as a clock generator of a microprocessor.

The device of Embodiment 2 consists of a reference clock generator (REF_CLKGEN) 21, the microprocessor 27, and peripheral ICs (PHE_ICs) 16-1 and 26-2. The microprocessor 27 is made up of the spread spectrum clock generator (SS-CLK_GEN) 22 according to the present invention, a CPU 23, logic circuitry (LGGIC_CKT) 24, and I/O 25 for interfacing with the peripheral ICs 26-1 and 26-2.

The reference clock generator 21 may be a crystal oscillator or similar oscillator which generates a stable signal that can serve as a reference clock. The output of the reference clock generator 21 is input to the spread spectrum clock generator 22 which generates a spread spectrum clock. The output of the spread spectrum clock generator 22 is supplied to the CPU 23, logic circuitry 24, and I/O 25 of the microprocessor 27 through a clock bus to allow these entities to cooperate. The peripheral ICs 26-1 and 26-2 are connected to the microprocessor via the I/O 25 and configured to perform data transfer by request and make it possible to carry out proper signal processing as a whole.

In this configuration, the spread spectrum clock generator 22 supplies the clock to the entities outside the microprocessor 27 as the operating clock signal for the ICs (for example, peripheral ICs 26-1 and 26-2) outside the microprocessor 27. Thereby, the microprocessor 27 can operate with the peripheral ICs in the same clock phases.

Embodiment 3

Figure 12:
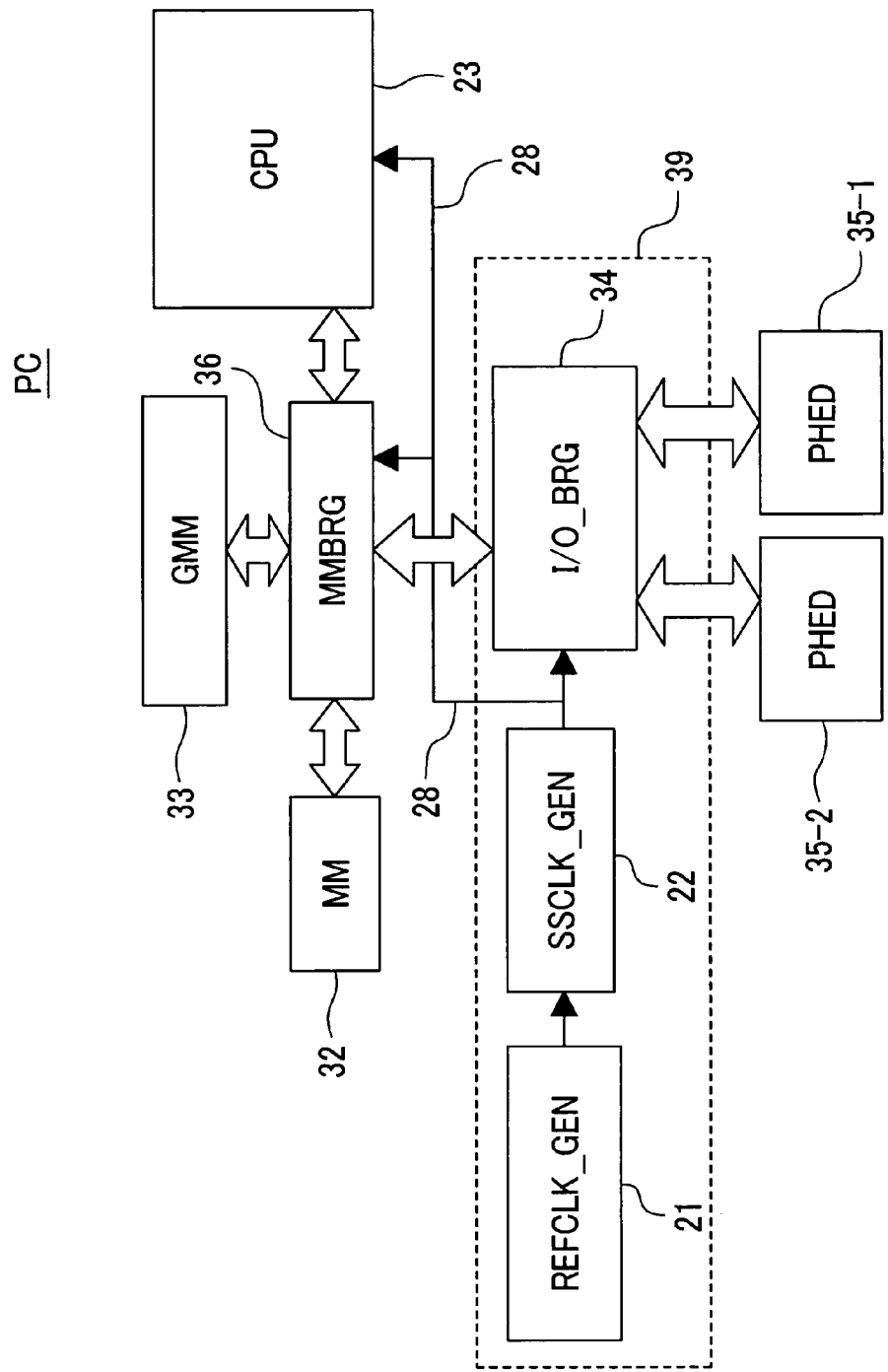
FIG. 12 is a diagram showing another example of application of the spread spectrum clock generator according to the present invention.

Next, a third preferred embodiment of the present invention is discussed. FIG. 12 is a structural diagram of a device like a personal computer (PC) comprising an CPU and individual integrated circuits connected to it, wherein the spread spectrum clock generator according to the present invention described in the Embodiment 1 section is applied. The personal computer essentially consists of the CPU 23, a memory bridge (MMBRG) 36 which performs data transfer to/from a memory (MM) 32 and a graphic memory (GMM) 33, and an I/O bridge integrated circuit 39 which includes an I/O bridge (I/O_BRG) 34 which makes connection to peripheral devices (PHEDs) 35-1, 35-2.

Here, in most cases, as the peripheral devices 35-1, 35-2, storage devices such as hard disks, DVDs (Digital Versatile Discs), and CDs (Compact Discs) are used. However, the personal computer configuration is not limited to that shown in FIG. 12 and the peripheral device types may vary, according to the purpose for which the computer is used.

The CPU 23 is connected to the memory bridge 36 and data transfer between the CPU 23 and the memory 32 and graphic memory 33 can be performed. The memory bridge 36 is connected to the I/O bridge 34 and connected to the peripheral device 35-1 (for example, a hard disk) and peripheral device 35-2 (for example, a DVD-RAM) via the I/O bridge 34. Because the computer thus comprises a plurality of integrated circuits, a clock bus 28 is long. Hence, it is important to reduce EMI. In the configuration of FIG. 12, the reference clock generator (RFCLK_GEN) 21 and the spread spectrum clock generator (SSCLK_GE) 22 are built in the I/O bridge integrated circuit 39 and supply the clock to components internal to the I/O bridge 34, the memory bridge 36, and the CPU 23. Thereby, it becomes possible to supply the spread spectrum clock from a single source to all parts of the personal computer PC.

However, although the configuration of FIG. 12 is the instance where the I/O bridge 34, reference clock generator 21, and spread spectrum clock generator 22 are integrated into one entity, needless to say, this instance is not restrictive and the above clock generators can be built in the memory bridge 36 or the CPU 23.

Embodiment 4

A fourth preferred embodiment of the present invention is discussed.

Figure 13:
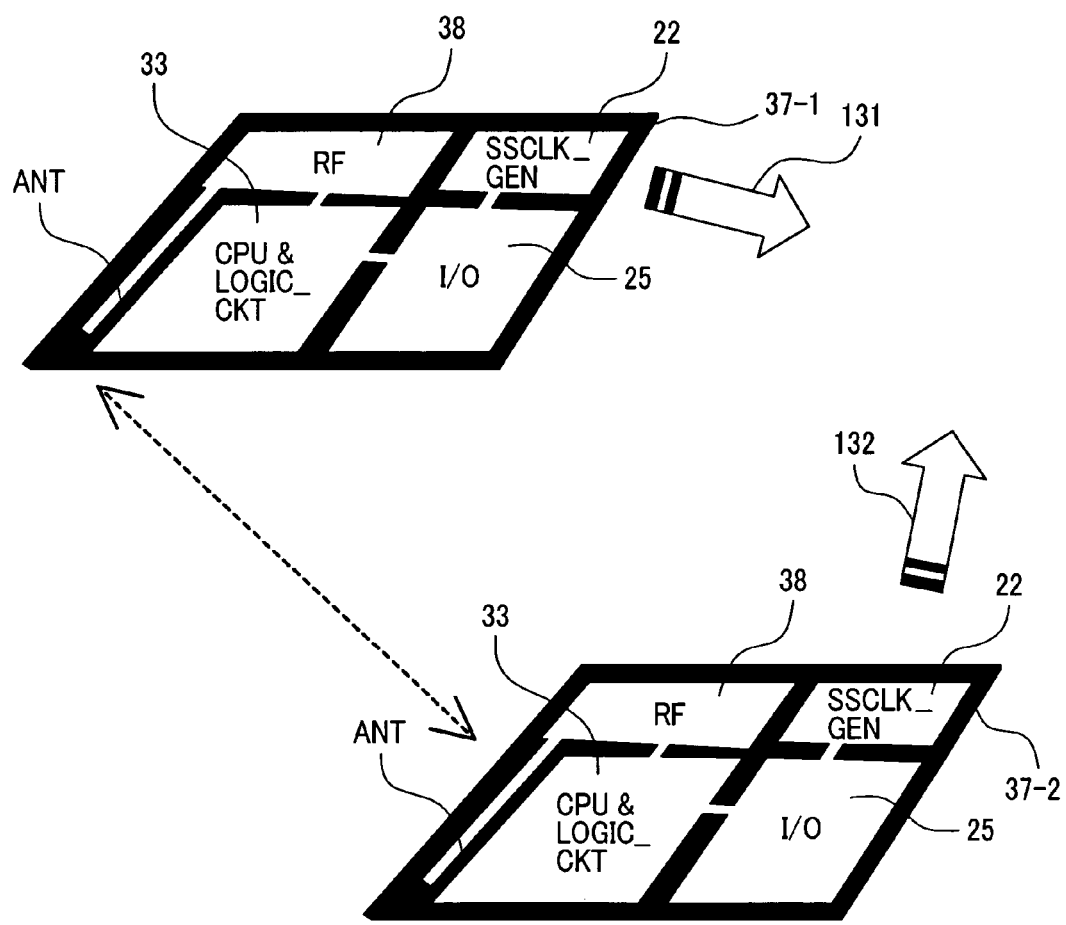
FIG. 13 is a diagram showing yet another example of application of the spread spectrum clock generator according to the present invention.

Furthermore, as another example of application of such microprocessor, micro ICs 37-1, 37-2 on which radio frequency communications circuit (RF) blocks 38 are installed respectively are shown in FIG. 13. The micro ICs 37-1, 37-2 are constructed on one or a plurality of integrated circuits, each consisting of an RF block 38, an antenna ANT, a CPU and logic circuitry block (CPU & LOGIC_CKT) 33, I/O 25, and a spread spectrum clock generator (SSCLK_GEN) 22.

Such micro ICs 37-1, 37-2 have an application that information is collected from on-chip sensors or off-chip sensors outside the microprocessor via the I/O 25 and the information is communicated between the micro ICs 37-1, 37-2 by wireless communication (as indicated by a dotted arrow in FIG. 13). The RF block 38 comprises an RF analog circuit for wireless communication and its control circuit. The CPU and logic circuit block 33 performs power control within each micro IC chip and sensed data collection and manipulation.

If the above application is taken into consideration, the micro IC chips are required to be exposed or housed in very simple packages. If Electro Magnetic Interference 131, 132 takes place, as shown in FIG. 13, shielding the micro IC chips or taking similar countermeasures to suppress the interference will be very difficult in terms of size and cost. Here, by applying the spread spectrum clock generator 22 of the present invention for the clock generator circuit built on each micro chip IC 37-1, 37-2, suppressing the occurrence of Electro Magnetic Interference and simple micro IC packaging can be realized.

Embodiment 5

A fifth preferred embodiment of the present invention is discussed.

Figure 14:
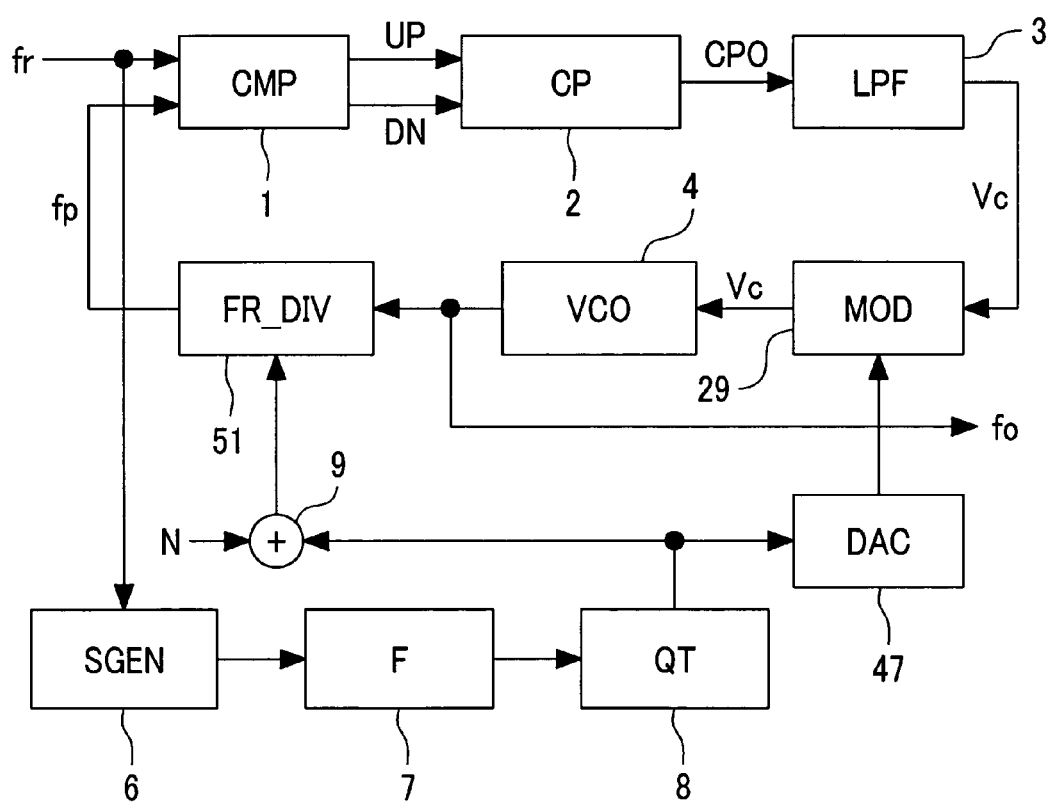
FIG. 14 is a diagram showing another configuration example of the spread spectrum clock generator according to the present invention.

FIG. 14 is a diagram showing another configuration example of the spread spectrum clock generator. The spread spectrum clock generator of Embodiment 5 comprises a phase comparator 1, a charge pump 2, a loop filter 3, a VCO 4, a fractional divider 51, a signal generator 6, a filter 7, a quantizer 8, and an adder 9, which correspond to those components of the clock generator shown in FIG. 1. In addition to the configuration of FIG. 1, wherein a signal having a value obtained by adding the quantizer 8 output and an average division number N is used to control the division number of the fractional divider 51, the clock generator of Embodiment 5 differs from that shown in FIG. 1 in that a modulator (MOD) 29 is connected between the loop filter 3 and the VCO 4 and an DAC 47 is added to convert the quantizer 8 output to an analog signal. Specifically, the clock generator of Embodiment 5 is a two-point modulation, spread spectrum clock generator configured such that the modulator 29 modulates an input signal to the VCO 4 with the output of the DAC 47.

The clock generator of Embodiment 5, in addition to the circuitry shown in FIG. 1, has the DAC 47 and modulator 29 and carries out the following method: divide a modulation signal for spreading the clock spectrum into a high frequency component and a low frequency component; directly add the high frequency component to the VCO 4 by the DAC 47 and modulator 29; and add the low frequency component to the PLL loop by the adder 9 and fractional divider 51. Thereby, a broader band width over which the clock spectrum can spread out can be obtained.

Embodiment 6

A sixth preferred embodiment of the present invention is discussed.

Figure 15:
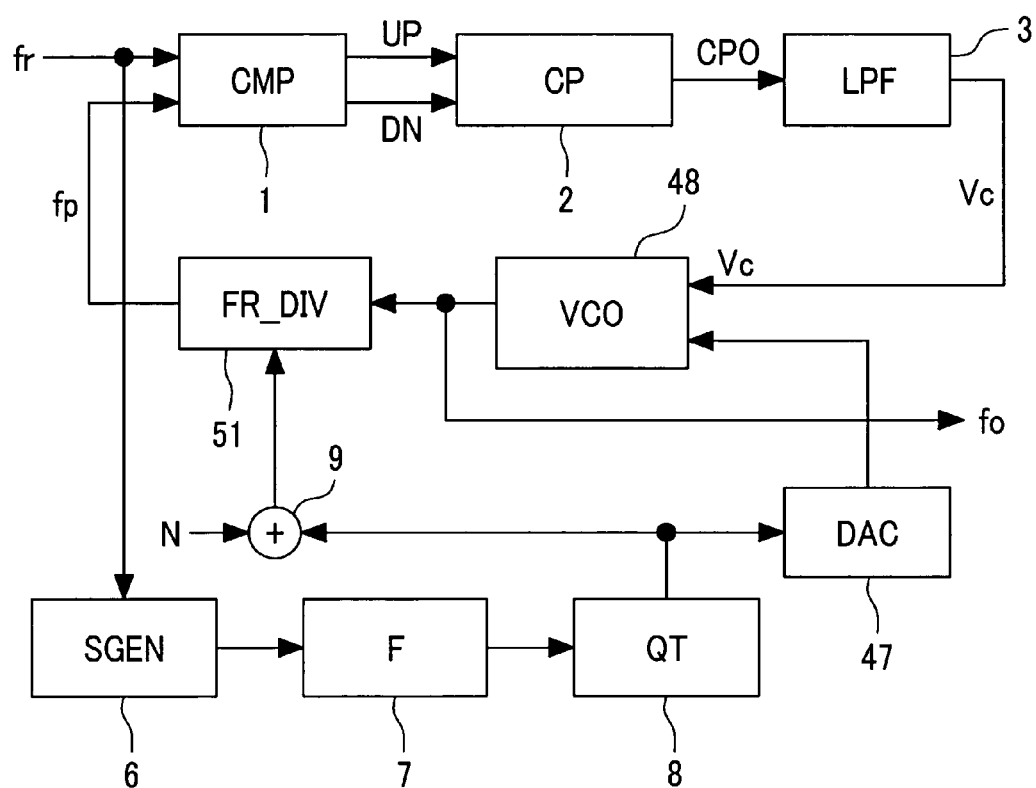
FIG. 15 is a diagram showing a still another configuration example of the spread spectrum clock generator according to the present invention.
Figure 16:
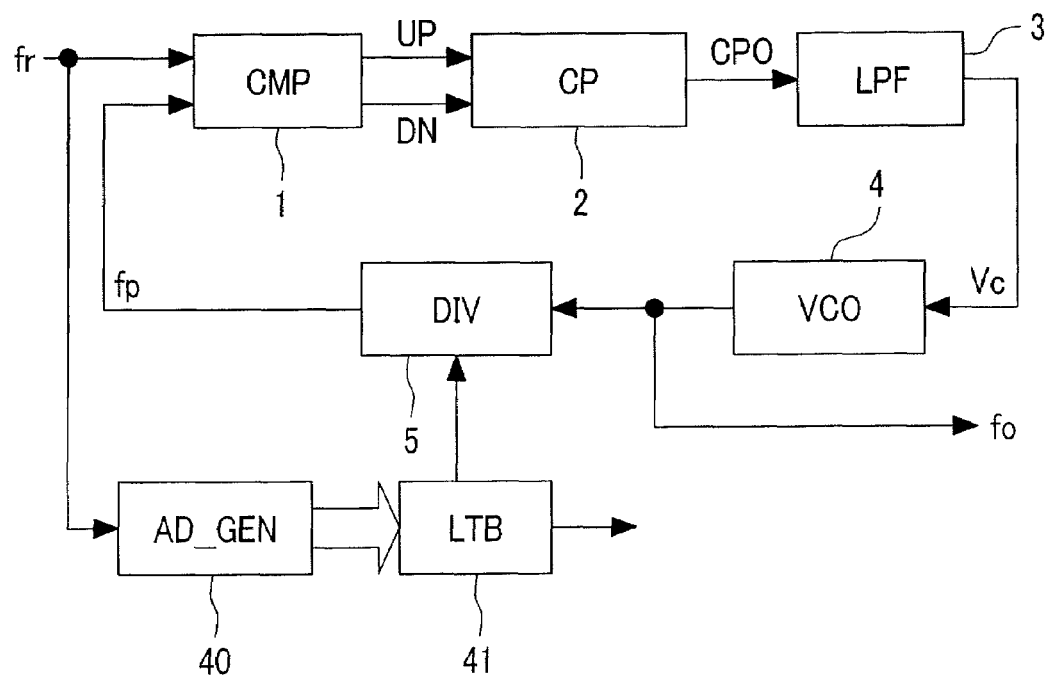
FIG. 16 is a diagram an example of a prior-art clock generator for reducing Electro Magnetic Interference.

FIG. 15 is a diagram showing a still another configuration example of the spread spectrum clock generator according to the present invention. The spread spectrum clock generator of Embodiment 6 comprises a phase comparator 1, a charge pump 2, a loop filter 3, a two-input VCO 48, a fractional divider 51, a signal generator 6, a filter 7, a quantizer 8, and an adder 9. In addition to the circuitry wherein a signal having a value obtained by adding the quantizer 8 output and an average division number N is used to control the division number of the fractional divider 51, the clock generator of Embodiment 6 is a two-point modulation, spread spectrum clock generator configured for enhanced modulation as follows: the output of the loop filter 3 is connected to one control terminal of the two-input VCO 38; an DAC 47 is added to convert the output of the quantizer 8 to an analog signal; and the output of the DAC 47 is connected to the other control terminal of the above two-input VCO 48.

The clock generator of Embodiment 6, in addition to the circuitry example shown in FIG. 1, has the two-input VCO 48 with two control terminals and the DAC 47 and carries out the following method: divide a modulation signal for spreading the clock spectrum into a high frequency component and a low frequency component; directly add the high frequency component of the modulating signal to the output of the VCO 4 by controlling the DAC 47 and the second control terminal of the two-input VCO 48; and add the low frequency component to the PLL loop by the adder 9 and fractional divider 51.

Thereby, a broader band width over which the clock spectrum can spread out can be obtained. Here, the two-input VCO is a VCO with two control terminals; for example, it can be constructed as an oscillator employing two variable capacitors.

Embodiment 7

A seventh preferred embodiment of the present invention is discussed.

Figure 22:
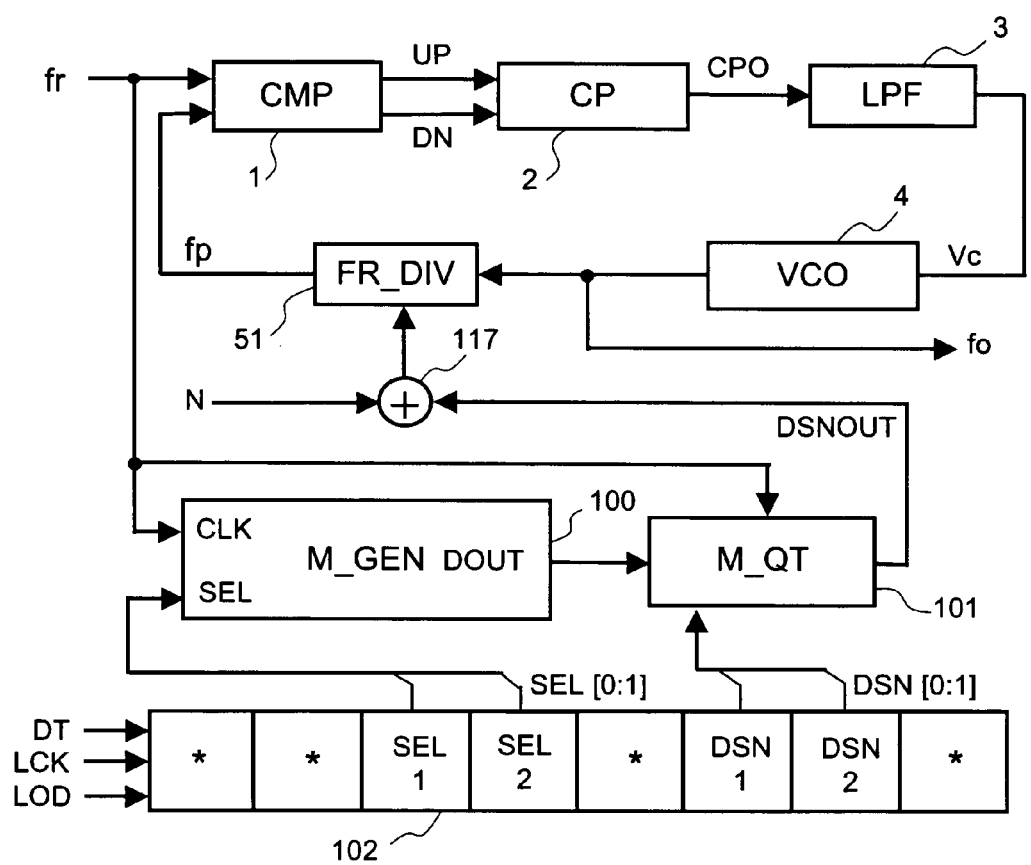
FIG. 22 is a diagram showing a further configuration example of the spread spectrum clock generator according to the present invention.

FIG. 22 is a diagram showing a further configuration example of the spread spectrum clock generator according to the present invention. The spread spectrum clock generator of Embodiment 7 comprises a phase comparator 1, a charge pump 2, a loop filter 3, a VCO 4, a fractional divider 51, a multi-mode disturbance signal generator (M_GEN) 100, a variable-order quantizer (M_QT) 101, and an adder 117. The clock generator of Embodiment 7 is configured such that a signal having a value obtained by adding the output DSNOUT of the variable-order quantizer 101 output and an average division number N is used to control the division number of the fractional divider 51. Furthermore, the multi-mode disturbance signal generator 100 and variable-order quantizer 101 are configured to be controlled by information stored in a shift register 102. The information can be rewritten from the external to the integrated circuit by three signals: data signal sequence DT, data transfer clock LCK, and enable signal LOD.

The shift register consists of a plurality of cascaded registers and its example consisting of eight registers is shown in FIG. 22. In practical application, even if some of registers provided for purposes such as on/off control of the circuits in the blocks of the integrated circuit are allocated for the function of the shift register 102, no problem will arise. In this example, control signals SEL1, SEL2 for the multi-mode disturbance signal generator 100 are assigned to third and fourth ones of the eight registers and control signals DSN1, DSN2 for the variable-order quantizer 101 are assigned to sixth and seventh ones. Needless to say, this bit assignment can be changed arbitrarily.

Figure 23:
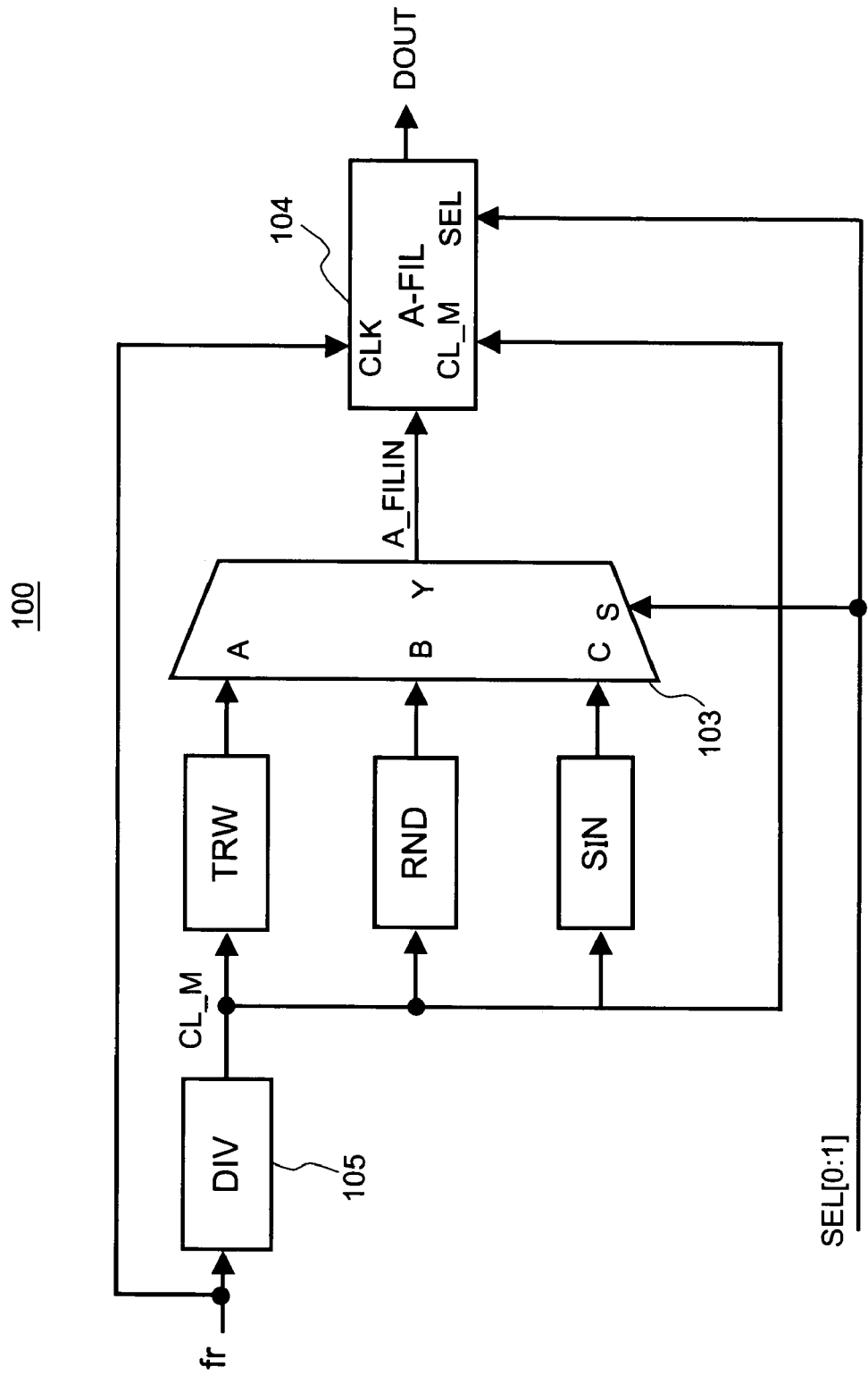
FIG. 23 is a block diagram showing a circuitry example of a multi-mode disturbance signal generator employed in the clock generator of FIG. 22.

FIG. 23 is a block diagram showing circuitry of the multi-mode disturbance signal generator 100. The multi-mode disturbance signal generator is a circuit capable of selectively generating one of a plurality types of disturbance signals such as, for example, a triangle wave signal, random signal, and sine wave signal. Byway of this configuration, according to Embodiment 7, a spread spectrum clock signal suitable for a device in which the invented clock generator is used can be generated.

Serial ATA Standard that is known as an interface between a personal computer or the like and its peripheral device recommends triangle waves, whereas great spurious suppression is required for the clock generator in the integrated circuit employed in mobile devices for which simple shielding is preferred. Configuring the clock generator so that a specific disturbance signal can be selected yields an advantage that random signals can be used to provide a greater spurious suppression effect. Because the band widths for sine wave and random signals are limited, it is preferable to use sine wave or random signals when it is wished to suppress jitters in high frequency components sufficiently.

Figure 25:
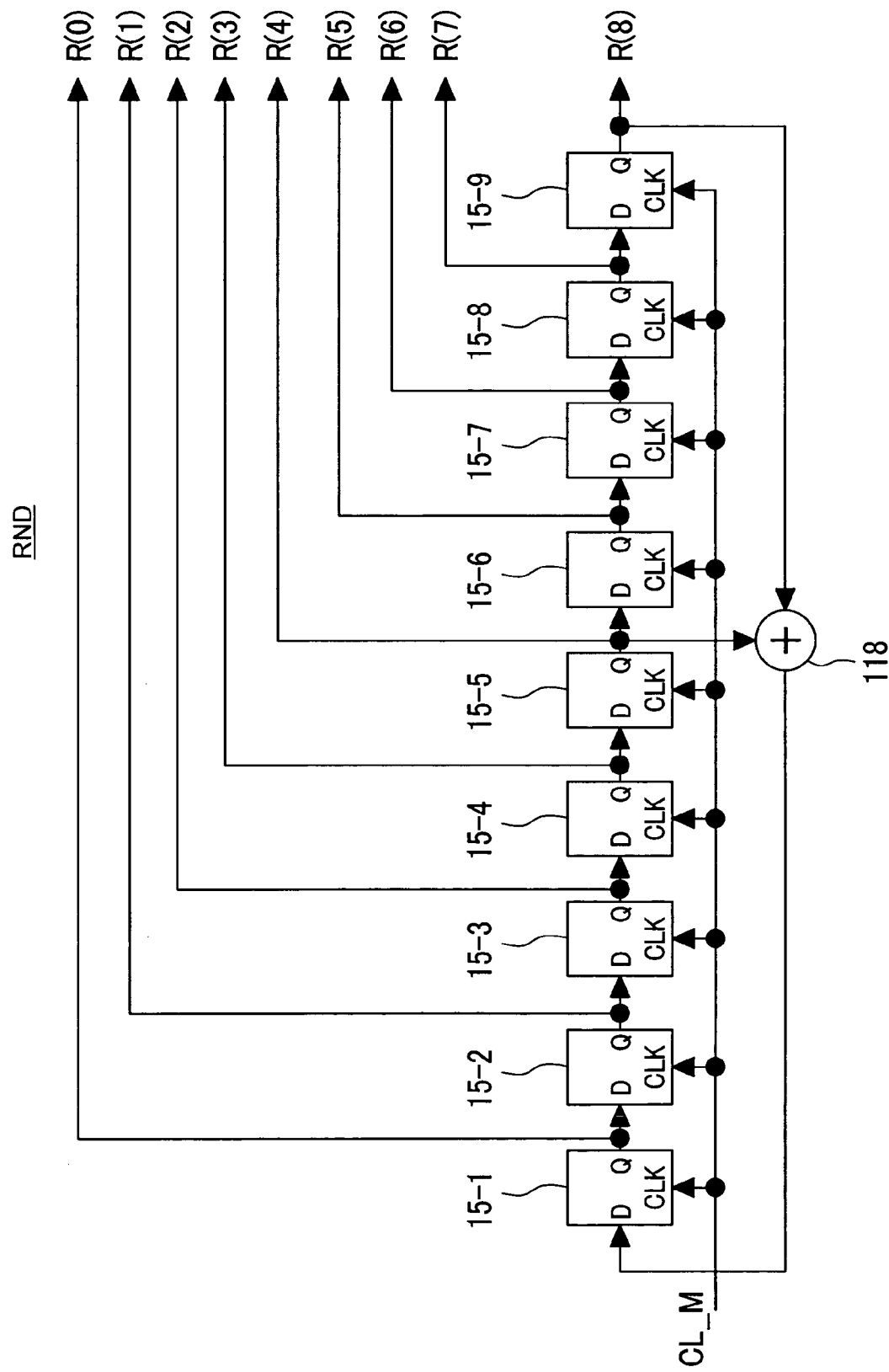
FIG. 25 is a block diagram showing a circuitry example of a random signal generator employed in the signal generator of FIG. 23.

The multi-mode disturbance signal generator 100 is made up of three signal generators for three signal types, namely, a triangle wave signal generator TRW, a random signal generator RND, and a sine wave signal generator SIN, a selector 103 for selecting one of the outputs of these signal generators, a variable filter 104 connected to the output Y of the selector 103, and a divider (DIV) 105 to generate an internal clock. Here, the random signal generator RND can be realized, based on its configuration example which will be described later and which is shown in FIG. 25. Other than the random signal generator RND, the triangle wave signal generator TRW and sine wave signal generator SIN can be realized simply in well-known configurations shown in FIGS. 2 and 3.

Next, using FIG. 23, a signal processing procedure of the multi-mode disturbance signal generator 100 is described. Here, signal identifiers CLK, CL_M, SEL, etc. also used to identify the terminals at which they terminate.

The multi-mode disturbance signal generator 100 that is capable of generating three types of disturbance signals, using the signal generators TRW, RND, and SIN shown in FIG. 23 operates, based on a clock CL_M. Although the description in this section assumes that three signal generators TRW, RND, and SIN are independent entities, if circuits that these signal generators can share are developed in installation design, it is no problem to integrate such circuits into a common block. The selector 103 is a multi-bit signal switching mechanism. The number of bits of the selector is set not less than a maximum number of bits of the output signals of the three signal generators TRW, RND, and SIN. In Embodiment 7, a select signal SEL consists of two bits (SEL[0:1]) and the selector is configured such that one of its inputs A, B, and C is selected, according to the values of the bits, and a signal at the selected input is passed to the Y output.

First, the reference clock fr is input as a clock, based on which the signal generator operates. The reference clock fr is input to the divider 105 and to a CLK input terminal of the variable filter 104. The reference clock fr is frequency divided by the divider 105 and a low speed clock CL_M is generated. The three signal generators TRW, RND, and SIN operate, based on the low speed clock CL_M and respectively output triangle wave, random wave, and sine wave signals, which are generated, according to settings, to the A, B, and C inputs of the selector 103. The selector 103 selects a signal indicated by the select signal SEL [0:1] and outputs the selected signal from the output terminal Y. The output signal of the selector undergoes processing such as removing out-of-band noise in the variable filter 104.

Next, FIG. 25 shows the random signal generator RND configuration. The random signal generator RND is made up of nine stages of cascaded delay elements 15-1 through 15-9 and an adder 118 which performs exclusive OR operation for the outputs of the fifth and ninth stage delay elements, wherein the output of the adder 118 is connected to the input of the first stage delay element 15-1. The nine stages of delay elements 15-1 through 15-9 operate, based on the clock CL_M, and are configured such that signal inputs to the D terminals of the delay elements are shifted to the next stage delay elements at the rise of the clock CL_M. To obtain highly accurate random numbers, the random signal generator shown here is configured to output a multi-bit signal into which the outputs R(0) through R(8) of the delay elements are combined. Although the number stages of delay elements are employed to generate random numbers in this example, needless to say, practically, the same function can be realized even if any number of stages of delay elements are used, and the number of stages can be changed.

Next, the variable filter 104 shown in FIG. 23 is configured such that its characteristics can be changed, depending on the value of the select signal (SEL "0:1") by which one of the three signal generators TRW, RND, and SIN is selected.

For example, when the triangle wave signal generator TRW is selected, it is desirable that the variable filter 104 realizes the function of a digital filter that performs first-order interpolation by which little attenuation of in-band frequencies occurs in order to preserve a triangular cusp-like wave shape. On the other hand, if the random signal generator RND or sine wave signal generator SIN is selected, it is appropriate that the variable filter 104 realizes a digital filter characteristic which limits the band width of the disturbance signal to a certain frequency and below, for example, on the order of 100 kHz. Therefore, when the random signal generator RND or sine wave signal generator SIN is selected, it is desirable to apply a second-order or third-order low pass filter for out-of-band noise suppression.

Figure 26:
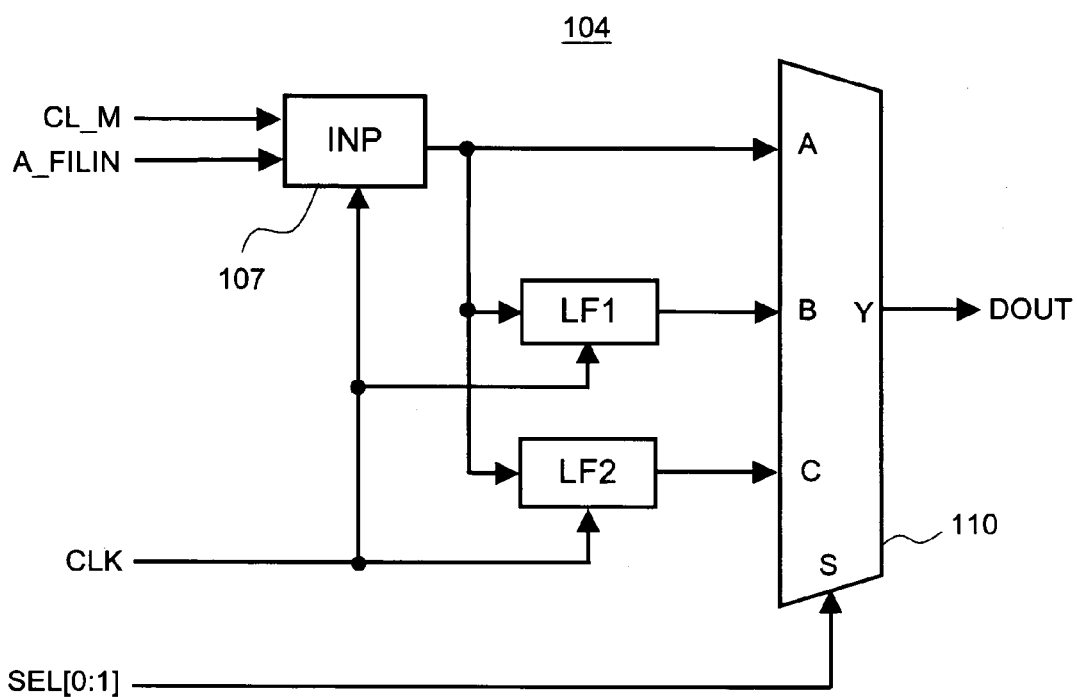
FIG. 26 is a block diagram showing a configuration of a variable filter employed in the signal generator of FIG. 23.

FIG. 26 shows the variable filter 104 configuration. The variable filter 104 is made up of a first-order interpolation filter (INP) 107 to which the clock CL_M and the Y output of the selector 103 (that is, filter input signal A_FILIN) and the clock CLK (that is, the reference signal fr) are input and which performs first-order interpolation, two band-limiting filters LF1, LF2 to suppress out-of-band noise from the output of the first-order interpolation filter 107, and a selector 110 which outputs one of signals input at terminals A, B, and C to output terminal Y, according to the select signal SEL [0:1] (that is, this output becomes the output DOUT of the multi-mode disturbance signal generator 104).

Figure 17:
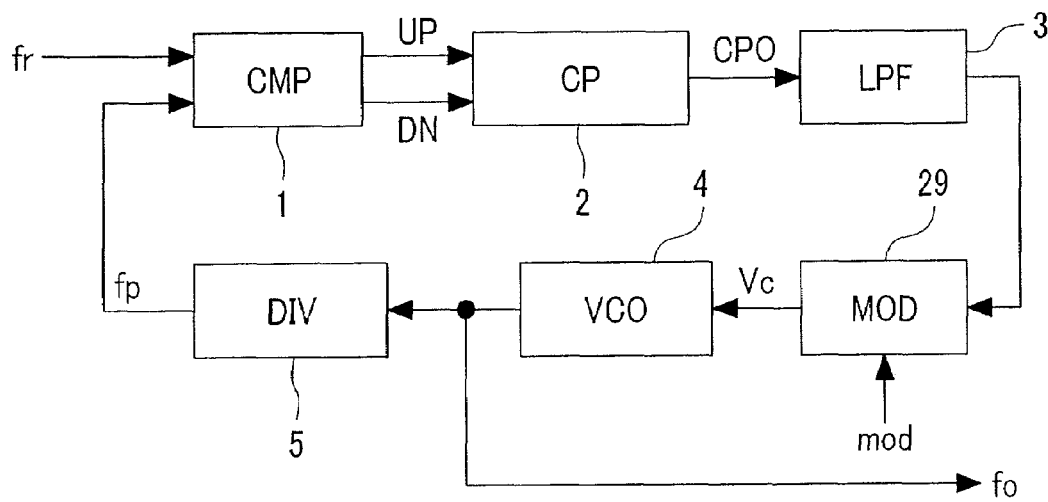
FIG. 17 is a diagram another example of a prior-art clock generator for reducing Electro Magnetic Interference.

In the following, the operation of the variable filter 104 will be discussed. First, refer to FIG. 17 that shows a configuration example of the first-order interpolation filter INP 107.

A transfer function of first-order interpolation having n sampling sections can be expressed by the following formula (1):

$$(1-z^{-n})/(1-z^{-1}) \quad (1)$$

Hence, the arithmetic operation of the first-order interpolation filter can be executed in such a way to integrate a difference value between two successive data n times and add the result to an older signal value for each integration.

The first-order interpolation filter 107 is made up of two cascaded delay elements 15-10, 15-11, an adder 119 to calculate a difference between the output DX1 of the delay element 15-10 and the output DX2 of the delay element 15-11 (DX1-DX2), a multiplier 112 which multiplies the output of the adder 119 by a factor of 1/M, an adder 120 which adds the output DX3 of the multiplier 112 and the output of a delay element 15-12, and an adder 121 to add the output of the delay element 15-12 and the output DX2 of the above delay element 15-11. Here, the output of the adder 120 is input to the delay element 15-12 and, thus, the adder 120 and the delay element 15-12 constitute an integrator.

Figure 28:
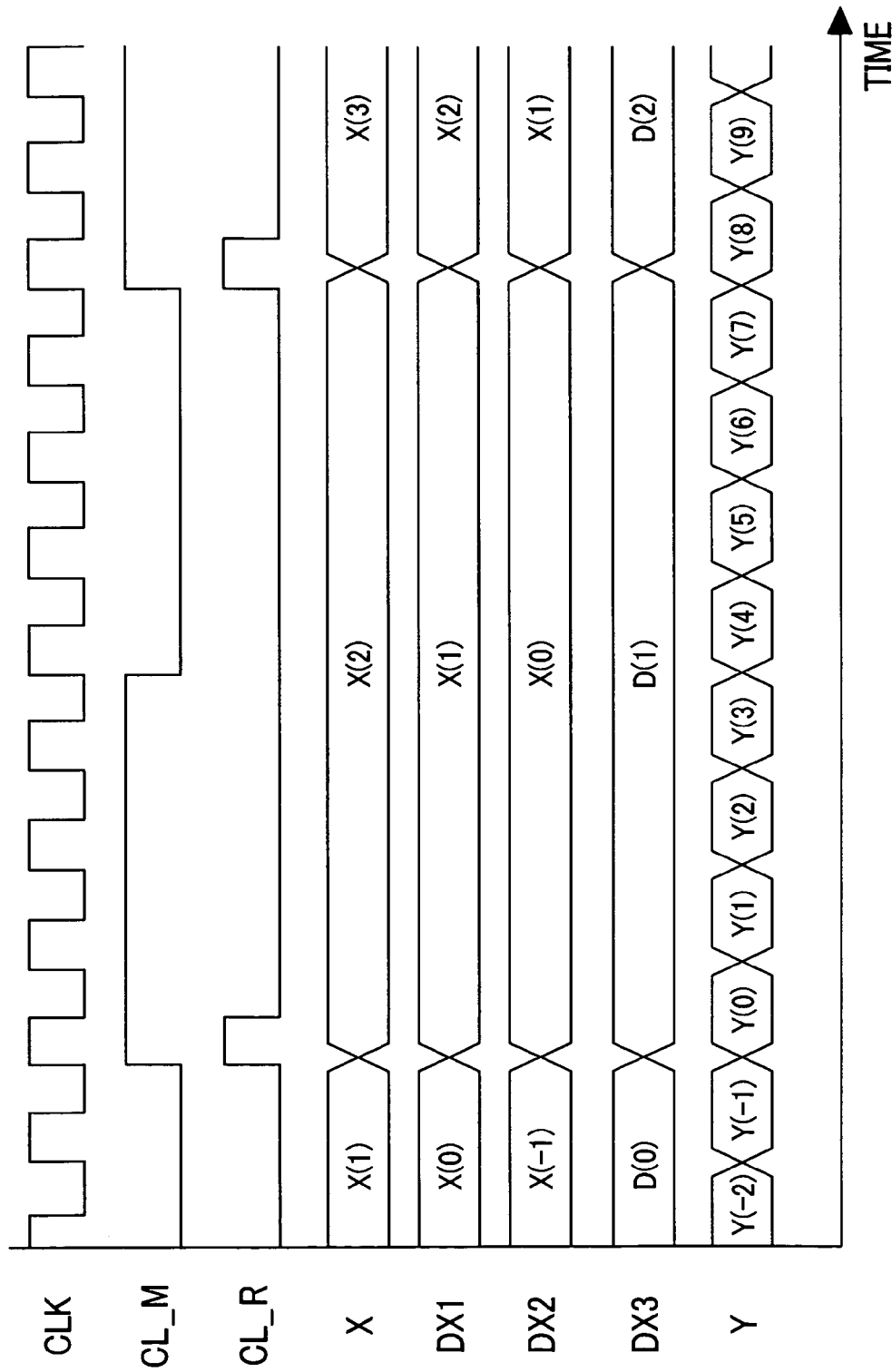
FIG. 28 is a time chart to explain the operation of the first-order interpolation filter in the configuration shown in FIG. 26.

FIG. 28 shows a time chart to explain the operation of the first-order interpolation filter 107. In FIG. 28, the waveforms of operating clocks CLK and CL_M, input signal X, internal signals CL_R, DX1, DX2, DX3, and output Y are shown. Although the clock CLK is eight times as fast as the clock CL_M for explanatory purposes, it is no problem to apply another factor than the factor of 8 in practical application.

A high ("H") output of the signal CL_R is triggered in sync with the leading edge of a pulse of the clock CL_M and remains for a half cycle of the clock CLK. This waveform is generated by an edge detector (EDG) 111. The edge detector 11, whose detailed configuration is not shown, can easily be realized by delay elements such as inverters and logic circuits such as AND.

For the input signal X, data is assumed to be updated in sync with the clock CL_M. In FIG. 28, data is updated in the order of X(1), X(2), and X(3). DX1 and DX2 are the outputs of the delay elements 15-10 and 15-11 which are driven by the clock CLK and, therefore, these signals are always delayed by one cycle and two cycles of the clock CL_M, respectively, with regard to the input signal X.

Next, for the outputs DX1 and DX2 of the delay elements, (DX1-DX2) is calculated by the adder 119 and, then the adder 119 output is multiplied by a factor of 1/M by the multiplier 112. The output DX of the multiplier 112 is expressed by the following formula (2):

$$DX3=D(N)=(X(N)-X(N-1)) \times 1/M \quad (2)$$

Here, N is an arbitrary number of sampling points and M is 8 because it is assumed that the clock CLK is eight times as fast as the clock CL_M, as described above.

Next, the output DX3 of the multiplier 112 is input to the integrator consisting of the adder 120 and the delay element 15-12. Because this integrator is reset by the clock CL_R at timing of the rise of the clock CL_M, X(0) is output as is for Y(0) in FIG. 28. In the next CLK cycle, ⅛×(X(1)−X(0)) is output from the integrator and, therefore, Y(1) is expressed by the following formula:

$$Y(1)=⅞ \times X(0)+⅛ \times X(1) \quad (3)$$

Subsequent Y values are expressed in the same way and Y(n) is expressed by the following formula:

$$Y(n)=n/M \times X(0)+(M-n)/M \times X(1) \quad (4)$$

Here, n corresponds to a number in parentheses affixed to Y.

Figure 27:
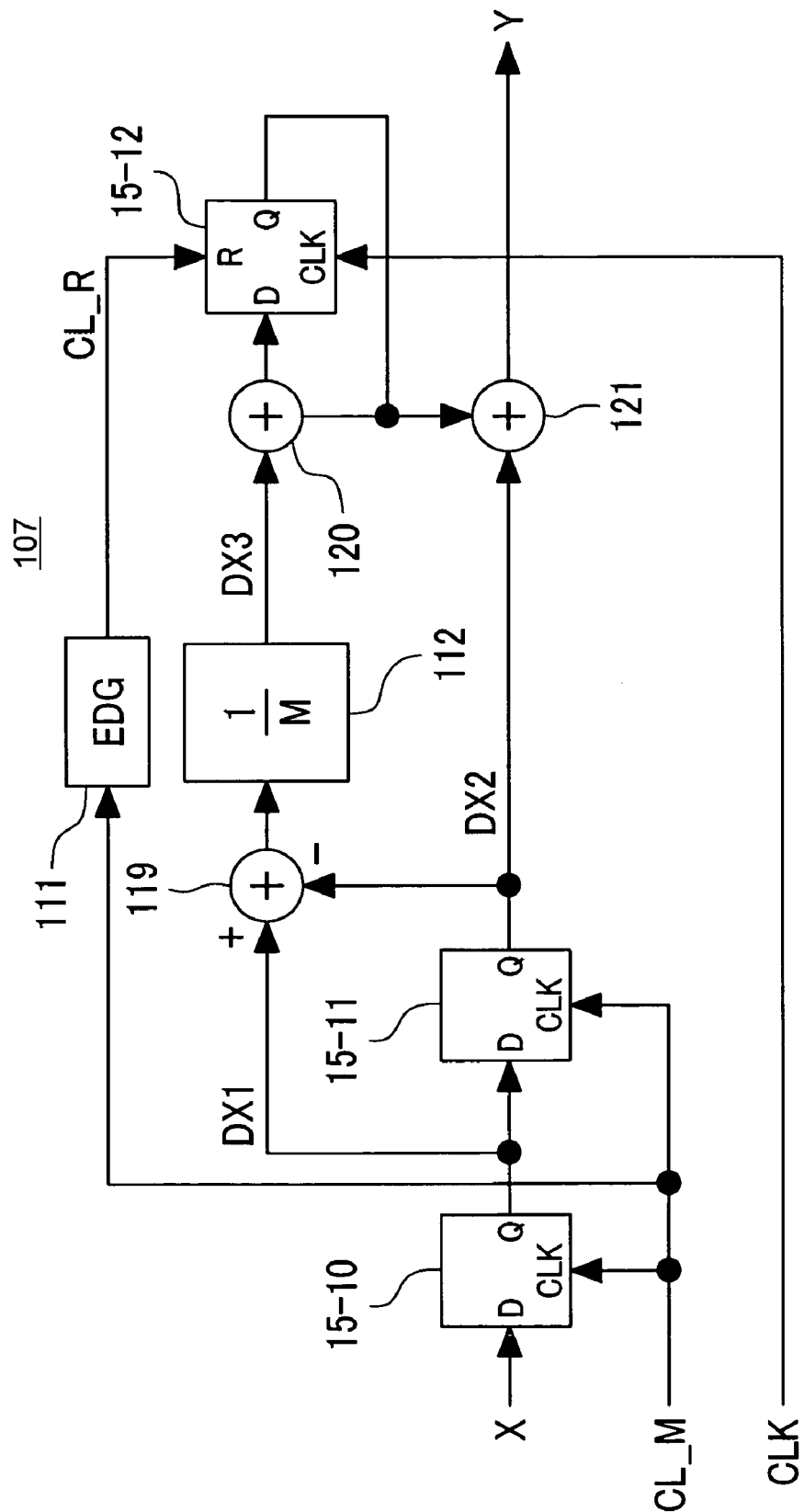
FIG. 27 is a block diagram showing a circuitry example of a first-order interpolation filter employed in the filter of FIG. 26.

As described above, the first-order interpolation filter 107 can be realized by way of the filter configuration shown in FIG. 27.

Next, the band-limiting filters LF1, LF2 shown in FIG. 26 are discussed. Here, as an example of a transfer function of the band-limiting filters, an example of a second-order low cutoff filter is discussed. Of course, three-order or more stages may be used in view of cutoff frequency characteristics. This is because, if a disturbance signal includes signal components beyond a proper band width, then it also includes high frequency component jitters, and there is a possibility that such jitters affect other systems as high frequency spurious effects.

The transfer function of the second-order low cutoff filter can be expressed by the following formula:

$$(1+A_0{}^* z^{-1}+A1 z^{-2})/(1-B_0{}^* z^{-1}-B_1 z^{-2}) \quad (5)$$

However, coefficients $A_0$, $A_1$, $B_0$, and $B_1$ can be changed arbitrarily, according to the borders of frequencies to be set.

Figure 29:
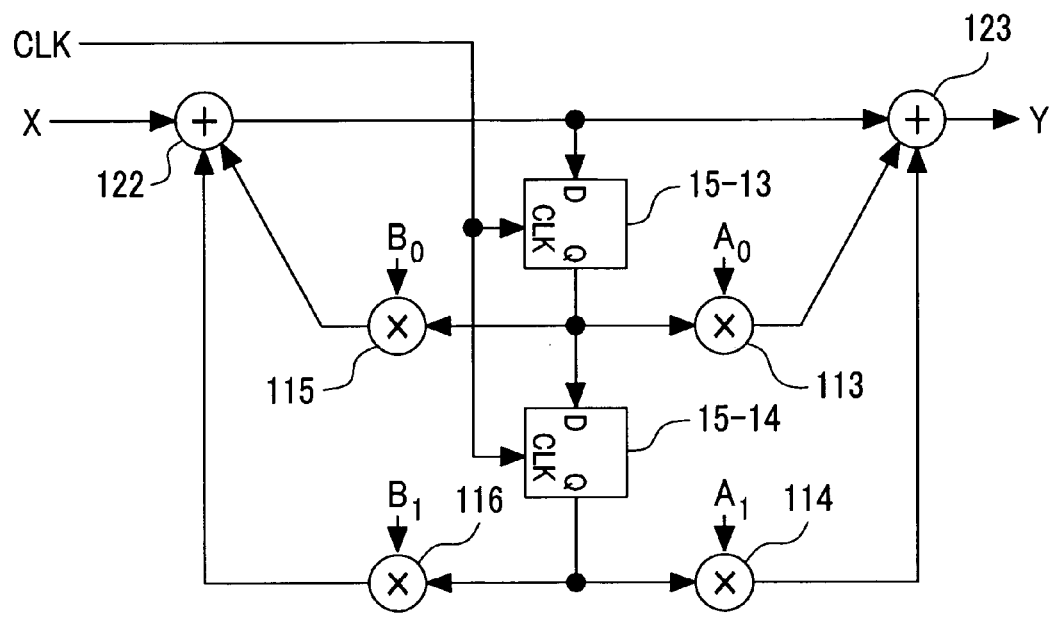
FIG. 29 is a block diagram showing a circuitry example of a band-limiting filter employed in the filter of FIG. 26.

FIG. 29 shows the band-limiting filter LF1 configuration to realize the above transfer function. The band-limiting filters LF1, LF2 have the same structure, but their cutoff frequency characteristics can be changed by changing the coefficients $A_0$, $A_1$, $B_0$, and $B_1$. Here, the band-limiting filter LF1 is discussed. The band-limiting filter LF1 is made up of two cascaded delay elements 15-13, 15-14, four multipliers 113, 114, 115, 116 which are connected in place to the outputs of the delay elements 15-3, 15-4 to multiply these outputs by the coefficients $A_0$, $A_1$, $B_0$, and $B_1$ respectively, an adder 122 which adds the output of the multiplier 115, the output of the multiplier 116, and the input signal X, and an adder 123 which adds the output of the adder 122, the output of the multiplier 113, and the output of the multiplier 114.

The input signal X is added to the outputs of the delay elements 15-13 and 15-14 by the adder 122. This operation corresponds to evaluating the denominator of the formula (5). Then, the output of the adder 122 is input to the delay element 15-13 and shifted to the delay element 15-14 in a cascade manner. The output of the adder 122 is also supplied to the adder 123 where that output is added to the outputs of the delay elements 15-3 and 15-4. This operation corresponds to evaluating the numerator of the formula (5).

As described above, the arithmetic operation of the band-limiting filter, represented by the formula (5), can be realized by way of the filter configuration shown in FIG. 29.

Figure 24:
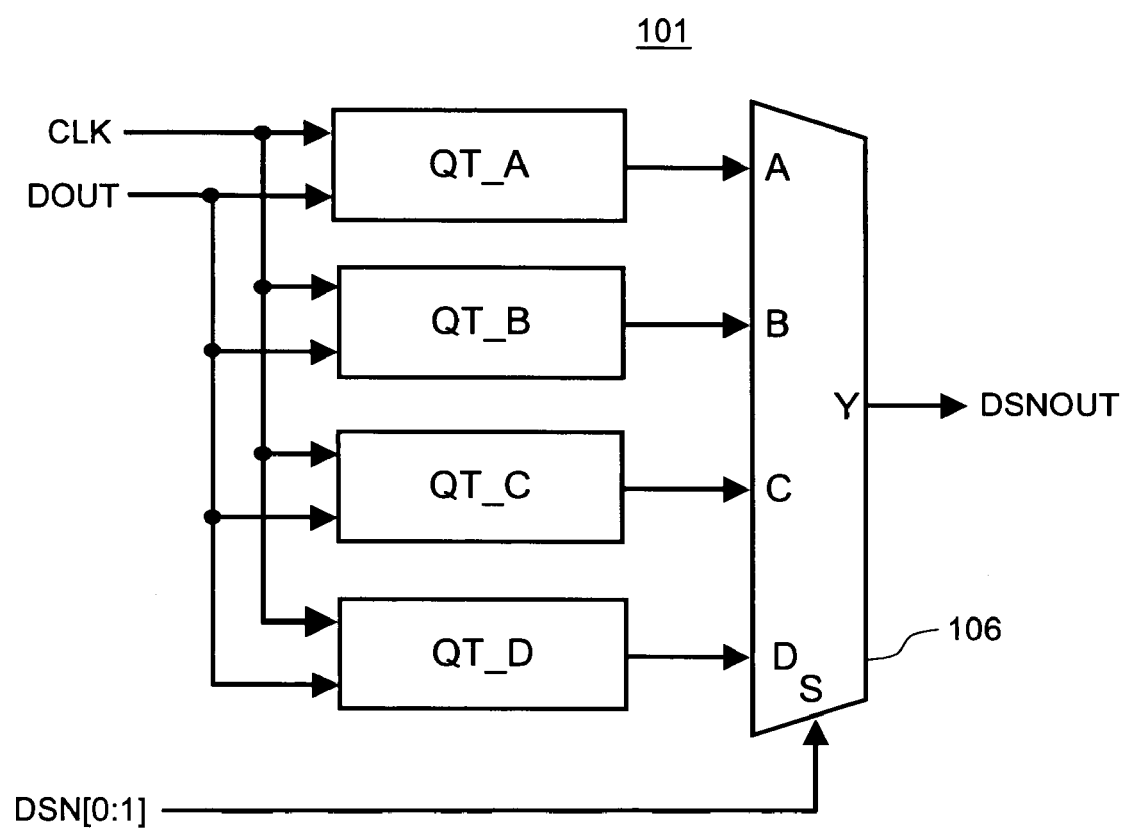
FIG. 24 is a diagram showing a configuration example of a variable-order quantizer employed in the clock generator of FIG. 22.

Next, FIG. 24 shows the variable-order quantizer 101 configuration. The variable-order quantizer shown in FIG. 24 operates, based on the reference clock CLK, and is made up of a plurality of quantizer circuits QT_A, QT_B, QT_C, and QT_D to which the output DOUT of the multi-mode disturbance signal generator 100 in the preceding stage is input and a selector 106. By a select signal DS [0:1], one of the plurality quantizer circuits is selected and output as the output DSNOUT of the variable-order quantizer from the Y output terminal. Although the quantizer circuits of any type and any form may be employed here, for example, they have been configured to be selected from a first-order delta-sigma (ΔΣ) type, second-order ΔΣ type, n-order ΔΣ type, and cascaded type. According to application, configuration setting may be changed.

In the case where the quantizer circuits perform ΔΣ modulation, the number of orders and the sampling rate can be set appropriately to vary the peak point of a spread signal. As shown in FIG. 18, it is apparent that the peak level changes as the number of orders of ΔΣ quantizer changes. It is normally practiced that a high-order ΔΣ quantizer is used to decrease the spread spectrum in a low frequency band and make the spectrum broader in a high frequency region. However, this may cause jitters to increase in some application. For example, if Serial ATA applies, the standard specifies that jitters should be averaged among 250 samples. In such cases, if disturbance signal components spread by ΔΣ modulation are mapped to frequencies corresponding to averaging sections, jitters increase. In that event, it is desirable that selection among quantizer configurations can be made to set the number of orders of ΔΣ quantizer lower and to suppress the peak. Although, in this embodiment, the four quantizer circuits are independent entities as shown, it is possible in practical application to combine common elements of the above circuits' blocks and package them into a common block. In FIG. 24, the selector 106 has a function to select one of signals input at the input terminals A-D and output the selected signal to the output terminal Y.

The above-described clock generator of Embodiment 7 shown in FIG. 22 enables selecting a disturbance signal type and the number of orders of quantizer for use. According to spread spectrum signal application, a suitable configuration can be selected from among the types of signal generators and quantizers. Thus, for an instance of application, if the microprocessor chip employing the above clock generator in used in some other integrated circuit device as an IP, an optimum configuration for actual operation can be determined easily by changing parameters if appropriate in actual setup conditions. As a result, countermeasures to reduce spurious noise for home electronics and mobile devices can be taken quickly.

For example, from among the signal generator types set forth in this Embodiment 7 section, a suitable one can be selected and set. If the triangle wave signal generator TRW is selected as the disturbance signal source, because the phase of the triangle wave signal oscillates continuously, variations in the clock can be absorbed into the spread spectrum in a receiving circuit capable of channel tracking at a constant rate. Particularly, the TRW generator is advantageous for cases where a narrow band receiving circuit must be configured in circumstances where signals attenuate to a large degree and noise is large due to long transmission length or for other reason.

If the random signal generator RND is selected, Electro Magnetic Interference suppression to a degree that is 3 dB and above greater than when the triangle wave signal generator TRW is selected (double in terms of electric power) can be achieved, which avoids the need to use much shielding material for the device in which the invented clock generator is employed. As a result, this yields an advantage that reduced size and less costly home electronics and mobile devices can be realized easily.

If the sine wave signal generator SIN is selected, the disturbance signal comes to have a double or triple frequency in the spread spectrum and accompanying spurious noise can be reduced greatly. It becomes easy to apply the spread spectrum technique to a system (such as a serial transmission/reception interface) that is sensitive to jitters (variations in the clock) in a medium-degree noise frequency band (for example 100 kHz to 1 MHz). As a result, I/O signal lines can be reduced, an interface unit with reduced size can be designed, and, ultimately, smaller mobile devices can be realized.

What is claimed is:

1. The spread spectrum clock generator comprising:
   a phase locked loop which comprises a phase comparator to which a reference clock is input, a voltage control oscillator which generates an oscillation frequency that is variable in response to said phase comparator output, and a first divider which divides said voltage control oscillator output by an alterable division number, wherein said first divider output is fed back to said phase comparator;
   a disturbance signal generator which includes at least one signal generator to generate a function of digital representation and which generates a disturbance signal with a band limiting characteristic that is variable, depending on said function;
   at least one quantizer which converts non-integral data in the fraction part included in an output of said disturbance signal generator to an integer by integral approximation;
   a control circuit which controls division number change on said first divider; and
   a changing means for externally changing a disturbance signal type to be generated by said disturbance signal generator and a type of said quantizer wherein:
   said disturbance signal generator comprises:
   a plurality of signal generators which operate, based on a first internal clock;
   a first selector which selects an output of one of said plurality of signal generators, according to a first select signal; and
   a variable filter which removes out-of-band noise from a signal output from said first selector and outputs the signal as a disturbance signal.

2. The spread spectrum clock generator according to claim 1, wherein said control circuit comprises a first adder which adds said quantizer output and said division number.

3. The spread spectrum clock generator according to claim 1, said changing means comprises a shift register whose contents data can be rewritten externally.

4. The spread spectrum clock generator according to claim 1, wherein:
   said variable filter has its filter characteristic to remove said out-of-band noise, the filter characteristic varying, depending on said first select signal.

5. The spread spectrum clock generator according to claim 1, wherein:
   said first selector is a multi-bit signal switching mechanism with the number of bits being set to at least a maximum number of bits of said plurality of signal generators.

6. The spread spectrum clock generator according to claim 1, wherein:
   said first internal clock is a clock obtained by frequency-dividing said reference clock.

7. The spread spectrum clock generator according to claim 1, wherein:
   said plurality of signal generators are a random signal generator, a triangle wave signal generator, and a sine wave signal generator.

8. The spread spectrum clock generator according to claim 1, wherein:
   said variable filter comprises:
   a first-order interpolation filter to which said first internal clock and said first selector output are input and which operates, based on said reference clock;

a first band-limiting filter to which said first-order interpolation filter output is input and which operates, based on said reference clock;

a second band-limiting filter to which said first-order interpolation filter output is input and which operates, based on said reference clock; and a second selector which selects either of said first band-limiting filter output and said second band-limiting filter output, according to said first select signal.

9. The spread spectrum clock generator according to claim 8, wherein:

said first-order interpolation filter comprises:

first and second cascaded delay elements which operate, based on said first internal clock a third delay element which operates, based on said reference clock, and is reset by a second internal clock;

a second adder which calculates a difference between said first delay element output and said second delay element output;

a first multiplier which multiplies said second adder output by a factor of 1/M;

a third adder which adds said first multiplier output and said third delay element output; and a fourth adders which adds said second delay element output and said third delay element output, wherein said third adder output is input to said third delay element.

10. The spread spectrum clock generator according to claim 9, wherein said second internal clock is generated by an edge detector which detects a leading edge of a pulse of said first internal clock.

11. The spread spectrum clock generator according to claim 10, wherein said second internal clock has a high output for a half cycle of said reference clock, the high output being triggered in sync with the leading edge of a pulse of said first internal clock.

12. The spread spectrum clock generator according to claim 1, wherein said quantizer is a variable-order quantizer which comprises a plurality of types of quantizers to which said disturbance signal generator output is input and which operate, based on the reference clock, and a third selector which selects and outputs one of the outputs of said plurality of types of quantizers.

13. The spread spectrum clock generator according to claim 12, wherein said plurality of types of quantizers are quantizers which are selected from among a first-order delta-sigma $\Delta\Sigma$ type, a second-order delta-sigma $\Delta\Sigma$ type, n-order delta-sigma $\Delta\Sigma$ type, and a cascaded type; and wherein n is an integer greater than 2.

14. The spread spectrum clock generator according to claim 7, wherein said random signal generator operates, based on said first internal clock, and comprises 2K+1(where K=0, 1, 2, 3 . . . ) stages of cascaded delay elements and a fourth adder which performs exclusive OR operation of for the output of a delay element in (K+1)-th stage and the output of a delay element in (2K+1)-th stage, wherein said fourth adder output is connected to an input of a first-stage delay element, and wherein signal inputs to said delay elements are shifted to the next stage delay elements, triggered by said first internal clock.

15. The spread spectrum clock generator according to claim 14, wherein said random signal generator output is a multi-bit signal into which the outputs of said delay elements are combined.

16. The spread spectrum clock generator according to claim 8, wherein:

said first band-limiting filter comprises:

fourth and fifth delay elements which operate, based on said reference clock;

second, third, fourth, and fifth multipliers; and fifth and sixth adders, wherein said fourth delay element and said fifth delay element are cascaded, wherein said fifth adder output is connected to an input of said fourth delay element and an input of said sixth adder, wherein said fourth delay element output is input to said second and third multipliers, multiplied by a first factor by said second multiplier and fed to an input of said sixth adder, and multiplied by a second factor by said third multiplier and fed to an input of said fifth adder, wherein said fifth delay element output is input to said fourth and fifth multipliers, multiplied by a third factor by said fourth multiplier and fed to an input of said sixth adder, and multiplied by a fourth factor by said fifth multiplier and fed to an input of said fifth adder, and wherein said sixth adder output is said first band-limiting filter output.

17. The spread spectrum clock generator according to claim 8, wherein said second band-limiting filter has the same configuration as the configuration of said first band-limiting filter, but values that are assigned to said first to fourth factors in said second band-limiting filter differ from those that are assigned to said first to fourth factors in said first band-limiting filter.

18. A spread spectrum clock generator comprising:

a phase comparator to which a reference clock is input;

a voltage control oscillator which generates an oscillation frequency that is variable in response to said phase comparator output;

a divider which divides said voltage control oscillator output by an alterable division number;

a phase locked loop configured such that said divider output is fed back to said phase comparator;

a signal generator to generate digital random numbers, said signal generator comprising a shift register consisting of a plurality of cascaded delay elements and an adder which adds the outputs of at least two of the delay elements constituting said shift register, wherein said adder output is input to said shift register;

a filter which suppresses high frequency components of noise included in an output of said signal generator;

a quantizer which converts non-integral data in the fraction part included in an output of said filter to an integer by integral approximation; and a control circuit which comprises an adder which adds said quantizer output and an integer to control said division number, wherein the division number of said divider is changed by said control circuit output and the oscillation frequency of said voltage control oscillator is modulated by said quantizer output.

19. An integrated circuit device comprising, internally, a CPU, signal processing devices, installed on a semiconductor chip, and a clock generator which generates a clock, based on which said signal processing devices operate, wherein said clock generator is a spread spectrum clock generator comprising:

a phase locked loop which comprises a phase comparator to which a reference clock is input, a voltage control oscillator which generates an oscillation frequency that is variable in response to said phase comparator output, and a divider which divides said voltage control oscillator output by an alterable division number, wherein said divider output is fed back to said phase comparator;

a disturbance signal generator which includes at least one signal generator to generate a function of digital representation and which generates a disturbance signal with a band limiting characteristic that is variable, depending on said function;

a quantizer which converts non-integral data in the fraction part included in an output of said disturbance signal generator to an integer by integral approximation; and a control circuit which comprises an adder which adds said quantizer output and a second integer to control said division number, wherein the division number of said divider is changed by the control circuit output; and wherein:

said disturbance signal generator comprises:

a plurality of signal generators which operate, based on a first internal clock;

a first selector which selects an output of one of said plurality of signal generators, according to a first select signal; and a variable filter which removes out-of-band noise from a signal output from said first selector and outputs the signal as a disturbance signal.

20. The integrated circuit device according to claim 19, wherein:

said first internal clock is a clock obtained by frequency-dividing a voltage control oscillator output of said voltage control oscillator.

* * * * *